US012002406B2

(12) United States Patent
Xi

(10) Patent No.: US 12,002,406 B2
(45) Date of Patent: Jun. 4, 2024

(54) SHIFT REGISTER, METHOD FOR DRIVING SHIFT REGISTER, GATE DRIVING CIRCUIT AND DISPLAY PANEL

(71) Applicant: WUHAN TIANMA MICROELECTRONICS CO., LTD., Wuhan (CN)

(72) Inventor: Suping Xi, Wuhan (CN)

(73) Assignee: WUHAN TIANMA MICROELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 18/321,717

(22) Filed: May 22, 2023

(65) Prior Publication Data

US 2023/0290295 A1 Sep. 14, 2023

(30) Foreign Application Priority Data

Mar. 27, 2023 (CN) .......................... 202310309053.0

(51) Int. Cl.
*G09G 3/20* (2006.01)
*G11C 19/28* (2006.01)

(52) U.S. Cl.
CPC ........... *G09G 3/2092* (2013.01); *G11C 19/28* (2013.01); *G09G 2310/0267* (2013.01); *G09G 2310/0286* (2013.01)

(58) Field of Classification Search
CPC ... G09G 2310/0267; G09G 2310/0286; G09G 3/20; G09G 3/2092; G09G 3/3266; G09G 3/3677; G11C 19/28; Y02B 70/10
See application file for complete search history.

(56) References Cited

U.S. PATENT DOCUMENTS

| 11,847,955 | B1* | 12/2023 | Xi ........................ G09G 3/2096 |
| 2019/0333595 | A1* | 10/2019 | Zou ...................... G11C 19/287 |
| 2019/0333596 | A1* | 10/2019 | Zhu ...................... G11C 19/287 |
| 2020/0160929 | A1* | 5/2020 | Huang ................... G11C 19/28 |
| 2022/0036788 | A1 | 2/2022 | Shi et al. |

FOREIGN PATENT DOCUMENTS

| CN | 107967904 A | 4/2018 |
| CN | 109979374 A | 7/2019 |

* cited by examiner

*Primary Examiner* — Dmitriy Bolotin
(74) *Attorney, Agent, or Firm* — KILPATRICK TOWNSEND & STOCKTON LLP

(57) ABSTRACT

A shift register, a method for driving a shift register, a gate driving circuit and a display panel are provided. The shift register includes: a first output device, where a control terminal thereof is electrically connected to a first node, a first terminal thereof is electrically connected to a first clock signal terminal, and a second terminal thereof is electrically connected to an output terminal of the shift register; a first node control device including a first switch device and a second switch device, where the first switch device is electrically connected to the first node, a first power supply voltage signal terminal and a second node, and the second switch device is electrically connected to the second node, the first power supply voltage signal terminal and the first node.

20 Claims, 16 Drawing Sheets

Provide a turn-on level to the first node in the low level output phase, wherein the first switch device is switched on under control of the first node and writes a cut-off level of the first power supply voltage signal terminal to the second node, and the second switch device is switched off under control of the second node — S101

SHIFT REGISTER, METHOD FOR DRIVING SHIFT REGISTER, GATE DRIVING CIRCUIT AND DISPLAY PANEL

CROSS REFERENCE OF RELATED APPLICATION

This application claims priority to Chinese Patent Application No. 202310309053.0, titled "SHIFT REGISTER, METHOD FOR DRIVING SHIFT REGISTER, GATE DRIVING CIRCUIT AND DISPLAY PANEL", filed on Mar. 27, 2023 with the China National Intellectual Property Administration (CNIPA), which is incorporated herein by reference in its entirety.

FIELD

The present disclosure relates to the field of display, and in particular to a shift register, a method for driving a shift register, a gate driving circuit and a display panel.

BACKGROUND

A display panel generally includes multiple rows of gate lines and multiple columns of data lines. For example, a scanning driving signal is provided for the multiple rows of gate lines by a gate driving circuit consisting of multiple cascaded shift registers, to control the multiple rows of gate lines to open in sequence.

Embodiments of the present disclosure show that, in the related technology, a low level voltage signal outputted by the shift register is instable.

SUMMARY

A shift register, a method for driving a shift register, a gate driving circuit and a display panel are provided according to embodiments of the present disclosure, to solve the problem that a low level voltage signal outputted by the shift register is instable.

In one embodiment, a shift register is provided according to embodiments of the present disclosure. The shift register includes: a first output device and a first node control device. A control terminal of the first output device is electrically connected to a first node, a first terminal of the first output device is electrically connected to a first clock signal terminal, and a second terminal of the first output device is electrically connected to an output terminal of the shift register. The first node control device includes a first switch device and a second switch device. A control terminal of the first switch device is electrically connected to the first node, a first terminal of the first switch device is electrically connected to a first power supply voltage signal terminal, a second terminal of the first switch device is electrically connected to a second node. A control terminal of the second switch device is electrically connected to the second node, a first terminal of the second switch device is electrically connected to the first power supply voltage signal terminal, and a second terminal of the second switch device is electrically connected to the first node. In a low level output phase, the first switch device is configured to be switched on under control of the first node and write a cut-off level of the first power supply voltage signal terminal into the second node, and the second switch device is configured to be switched off under control of the second node.

In another embodiment, a method for driving a shift register is provided according to embodiments of the present disclosure. The shift register is the shift register according to the first aspect. The method includes: providing a turn-on level to the first node in the low level output phase, and the first switch device is switched on under control of the first node and writes a cut-off level of the first power supply voltage signal terminal into the second node, and the second switch device is switched off under control of the second node.

In one embodiment, a gate driving circuit is provided according to embodiments of the present disclosure. The gate driving circuit includes multiple cascaded shift registers according to the first aspect.

In yet another embodiment, a display panel is provided according to embodiments of the present disclosure. The display panel includes the gate driving circuit according to the embodiments.

According to the shift register, the method for driving a shift register, the gate driving circuit and the display panel provided by the embodiments of the present disclosure, in the low level output phase, the first switch device is switched on under control of the first node, and writes the cut-off level of the first power supply voltage signal terminal into the second node, and the second switch device is switched off under control of the second node. In this way, the cut-off level of the first power supply voltage signal terminal can be prevented from being transmitted to the first node via the second switch device, to avoid influencing the level of the first node and thus outputting a stable low level voltage signal. In addition, neither the first switch device nor the second switch device is connected to the clock signal terminal, to avoid influencing the first node due to jumping of a clock signal transmitted by the clock signal terminal and thus outputting the stable low level voltage signal.

BRIEF DESCRIPTION OF THE DRAWINGS

In order to illustrate the embodiments of the present disclosure more clearly, drawings to be used in the description of the embodiments of the present disclosure are briefly introduced below.

DETAILED DESCRIPTION OF EMBODIMENTS

Figure 1:
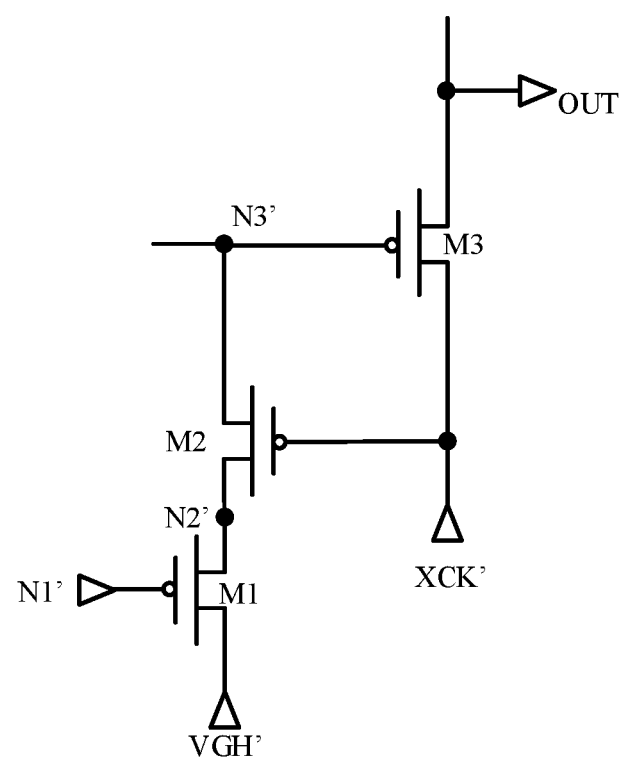
FIG. 1 is a schematic diagram of a local circuit of a shift register.

Various embodiments of the present disclosure are described in detail below. In order to illustrate the embodiments of the present disclosure more clearly, the present disclosure is described in detail below in conjunction with the drawings and embodiments. It should be understood that the embodiments described herein are intended to explain rather than restrict the present disclosure. The present disclosure may be implemented without some of the details. The embodiments are described below to better understand the present disclosure.

It should be noted that, the relationship terms such as first and second herein are used to distinguish one entity or operation from another entity or operation, and are unnecessary to indicate or imply that any actual relationship or order exits between these entities or operations. The term "include", "comprise" or any variant thereof is intended to encompass nonexclusive inclusion and a process, method, article or device including a series of elements includes not only those elements but also other elements which have been not listed definitely or an element(s) inherent to the process, method, article or device. Moreover, the expression "comprising a(n)" in which an element is defined will not preclude presence of an additional identical element(s) in a process, method, article or device comprising the defined element(s)" unless further defined.

It should be understood that the term "and/or" used herein indicates an association relationship between objects, and may include three relationships. For example, A and/or B may include: only A exists, both A and B exist, and only B exists. In addition, a character "/" herein indicates that a relationship of "or" exists between associated objects.

It should be noted that, the transistor in the embodiment of the present disclosure may be an N-type transistor or a P-type transistor. For the N-type transistor, the turn-on level is a high level, and the cut-off level is a low level. That is, when a gate of the N-type transistor is at a high level, a first pole and a second pole of the transistor are switched on; when the gate of the N-type transistor is at a low level, the first pole and the second pole of the transistor are switched off. For a P-type transistor, the turn-on level is a low level, and the cut-off level is a high level. That is, when a control pole of the P-type transistor is at a low level, a first pole and a second pole of the transistor are switched on; and when the control pole of the P-type transistor is at a high level, the first pole and the second pole of the transistor are switched off. In an implementation, the gate of the transistor serves as the control pole of the transistor; and depending on a signal and a type of the gate of the transistor, the first pole serves as a source and the second pole serves as a drain, or the first pole serves as a drain and the second pole serves as a source. In the embodiments of the present disclosure, the turn on level refers to any level enabling the transistor to be switched on, and the turn-off level refers to any level enabling the transistor to be cut off/switched off.

In the embodiments of the present disclosure, the term "electrically connected" may indicate that two components are directly electrically connected to each other, or may indicate that two components are electrically connected to each other via one or more other components.

In the embodiments of the present disclosure, the first node, the second node and the third node are defined to facilitate describing of the circuit structure, and the first node, the second node and the third node do not represent actual circuit devices.

Various modifications and changes may be made to the present disclosure without departing from the spirit and scope of the present disclosure. Therefore, the present disclosure is intended to cover all modifications and changes to the present disclosure falling within the scope of the claims (claimed solutions) and equivalents thereof. It should be noted that, the implementations of the embodiments of the present disclosure may be combined without a conflict.

Before the embodiments of the present disclosure are clarified, problems in the related art are illustrated in order to understand the embodiments of the present disclosure.

FIG. 1 is a schematic diagram of a local circuit of a shift register. As shown in FIG. 1, in related art, the shift register may include a transistor M1, a transistor M2 and a transistor M3. A gate of the transistor M1 is electrically connected to a first node N1', a first pole of the transistor M1 is electrically connected to a power supply voltage signal terminal VGH', and a second pole of the transistor M1 is electrically connected to a second node N2'. A gate of the transistor M2 is electrically connected to a clock signal terminal XCK', a first pole of the transistor M2 is electrically connected to the second node N2', and a second pole of the transistor M2 is electrically connected to a third node N3'. A gate of the transistor M3 is electrically connected to the third node N3', a first pole of the transistor M3 is electrically connected to the clock signal terminal XCK', and a second pole of the transistor M3 is electrically connected to an output terminal OUT of the shift register.

In the shift register, the transistor M1 and the transistor M2 form a high level maintaining device of the third node N3'. When the first node N1' is at a low potential, the transistor M1 is switched on, and a high level provided by the power supply voltage signal terminal VGH' is written into the second node N2'. When the clock signal terminal XCK' outputs a low level, the transistor M2 is switched on, and a high level provided by the power supply voltage signal terminal VGH' is written into the third node N3', to maintain the high level of the third node N3'. When the clock signal terminal XCK' outputs a high level, the transistor M2 is switched off, and the third node N3' is fixed at a high potential, that is, maintaining the high level of the third node N3'.

Embodiments of the present disclosure show that, when the first node N1' is switched to be at a high level, the transistor M1 is switched off, and the second node N2' maintains a high level provided by the power supply voltage signal terminal VGH'. When the clock signal terminal XCK' outputs a low level, the transistor M2 is switched on, and the high level of the second node NT is transmitted to the third node N3' via the transistor M2, resulting in fluctuation of the low level of the third node N3', and thus influencing the transistor M3 to normally output a low level voltage signal. In another embodiment, the clock signal provided by the clock signal terminal XCK' is a high frequency signal, that is, the clock signal frequently switches between a high level and a low level, the potential of the third node N3' fluctuates due to a parasitic capacitance of the transistor M2, thus influencing the transistor M3 to normally output a low level voltage signal, and resulting in that the low level voltage signal outputted by the shift register is instable.

In some embodiments, a shift register, a method for driving a shift register, a gate driving circuit and a display panel are provided according to embodiments of the present disclosure, to solve the problem in the related art that the low level voltage signal outputted by the shift register is instable.

The concept of the embodiments of the present disclosure is to provide a new circuit connection structure as follows. A control terminal of a first switch device is electrically connected to a first node, a first terminal of the first switch device is electrically connected to a first power supply voltage signal terminal, and a second terminal of the first switch device is electrically connected to a second node; a control terminal of a second switch device is electrically connected to the second node, a first terminal of the second switch device is electrically connected to the first power supply voltage signal terminal, and a second terminal of the second switch device is electrically connected to the first node. In a low level output phase, the first switch device is switched on under control of the first node, and writes a cut-off level of the first power supply voltage signal into the second node, and the second switch device is switched off under control of the second node.

In this way, the cut-off level of the first power supply voltage signal terminal can be prevented from being transmitted to the first node via the second switch device, to avoid influencing the level of the first node and thus outputting a stable low level voltage signal. In addition, neither the first switch device nor the second switch device is connected to the clock signal terminal, to avoid influencing the first node due to jumping of a clock signal transmitted by the clock signal terminal and thus outputting the stable low level voltage signal.

A shift register according to embodiments of the present disclosure is described below.

Figure 2:
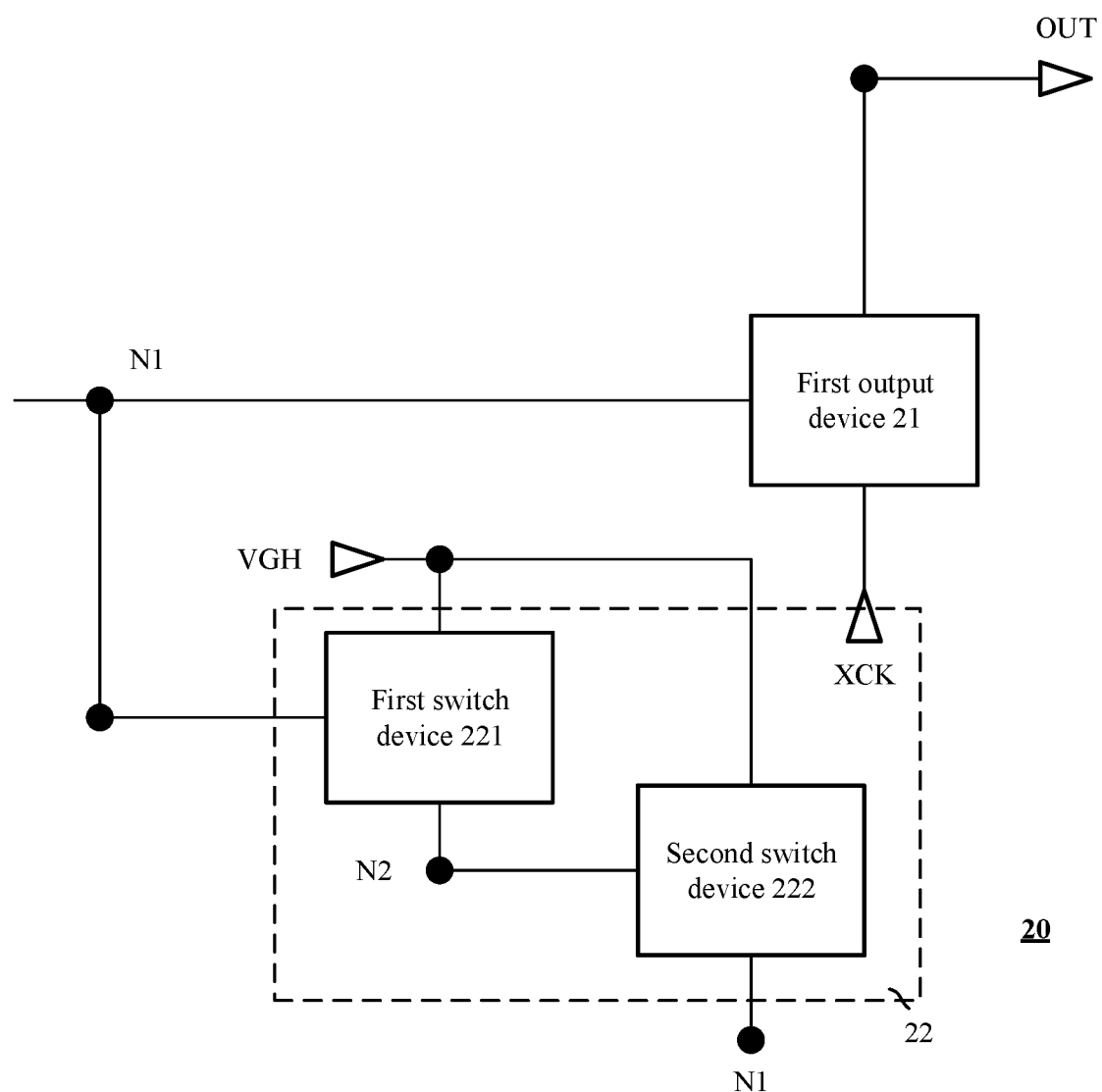
FIG. 2 is a schematic diagram of a circuit of a shift register according to an embodiment of the present disclosure.

FIG. 2 is a schematic diagram of a circuit of a shift register according to an embodiment of the present disclosure. As shown in FIG. 2, a shift register 20 provided according to the embodiment of the present disclosure may include a first output device 21 and a first node control device 22. A control terminal of the first output device 21 is electrically connected to a first node N1, a first terminal of the first output device 21 is electrically connected to a first clock signal terminal XCK, and a second terminal of the first output device 21 is electrically connected to an output terminal OUT of the shift register 20. The first output device 21 is switched on under control of the first node N1, and transmits a first clock signal of the first clock signal terminal XCK to the output terminal OUT of the shift register 20.

The first node control device 22 may include a first switch device 221 and a second switch device 222. A control terminal of the first switch device 221 is electrically connected to the first node N1, and a first terminal of the first switch device 221 is electrically connected to a first power supply voltage signal terminal VGH, and a second terminal of the first switch device 221 is electrically connected to a second node N2. A control terminal of the second switch device 222 is electrically connected to the second node N2, a first terminal of the second switch device 222 is electrically connected to the first power supply voltage signal terminal VGH, and a second terminal of the second switch device 222 is electrically connected to the first node N1.

In a low level output phase, that is, in a phase in which the shift register 20 outputs a low level voltage signal, the first switch device 221 is switched on under control of the first node N1, and writes a cut-off level of the first power supply voltage signal terminal VGH into the second node N2. The second switch device 222 is switched off under control of the second node N2.

In the low level output phase, a first clock signal provided by the first clock signal terminal XCK is a low level, the first output device 21 is switched on under control of the first node N1, and transmits the low level provided by the first clock signal terminal XCK to the output terminal OUT of the shift register 20. The shift register 20 outputs a low level voltage signal. The first switch device 221 is switched on under control of the first node N1, and writes a cut-off level of the first power supply voltage signal terminal VGH into the second Node N2. The second switch device 222 is switched off under control of the second node N2.

In this way, the second switch device 222 is switched off under control of the second node N2, and the cut-off level of the first power supply voltage signal terminal VGH can be prevented from being transmitted to the first node N1 via the second switch device 222, to avoid influencing the level of the first node N1 and thus outputting a stable low level voltage signal. In addition, neither the first switch device 221 nor the second switch device 222 is connected to the clock signal terminal (the XCK' shown in FIG. 1), to avoid influencing the first node N1 due to jumping of a clock signal transmitted by the clock signal terminal and thus outputting the stable low level voltage signal.

In order to maintain output of a high level voltage signal from the shift register 20, the shift register 20 may further include a third switch device. In a high level output phase, the third switch device is in cooperation with the second switch device, and the first node N1 is at a cut-off level, and thus the shift register 20 can output a stable high level voltage signal.

Figure 3:
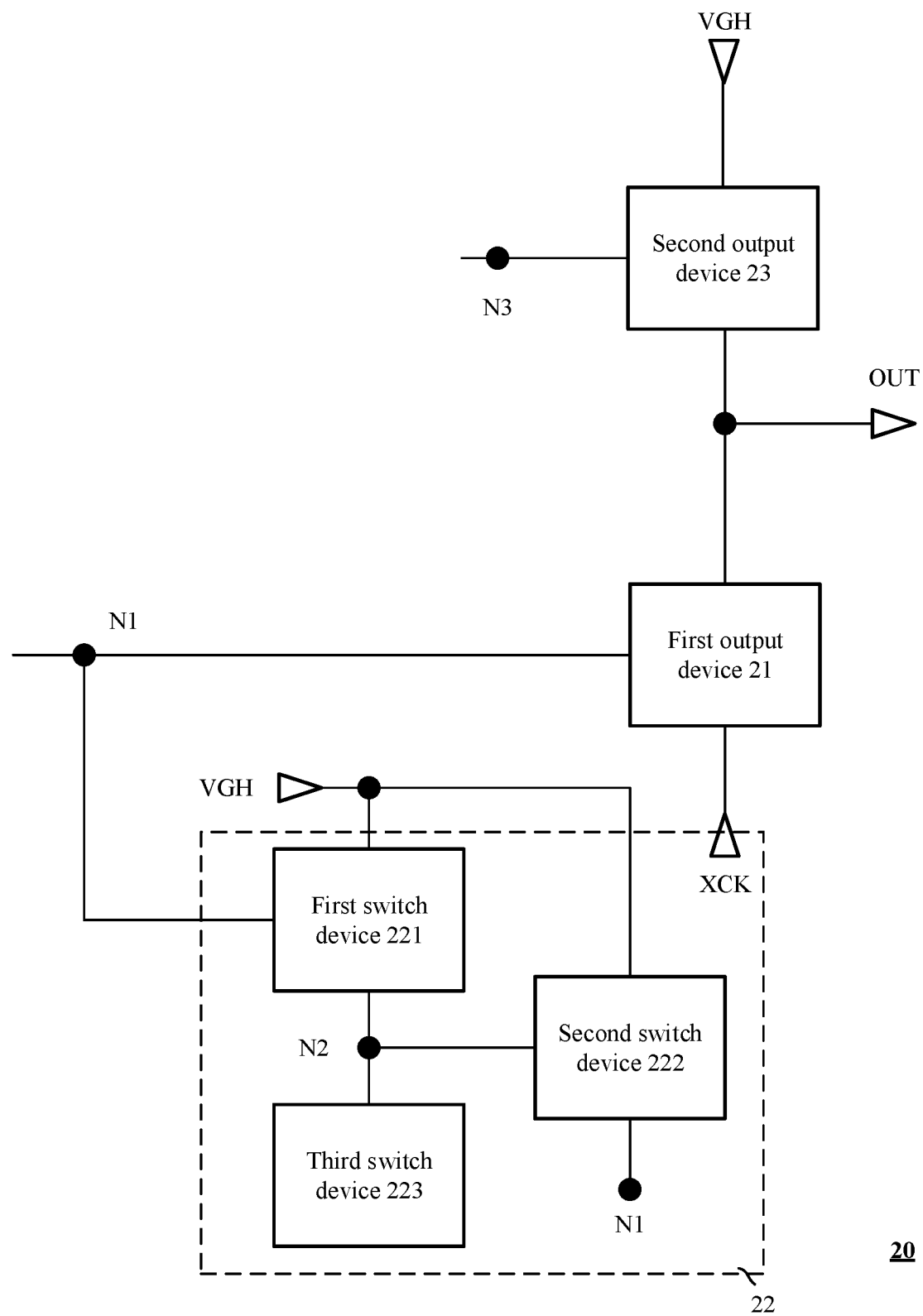
FIG. 3 is a schematic diagram of a circuit of a shift register according to another embodiment of the present disclosure.

FIG. 3 is a schematic diagram of a circuit of a shift register according to another embodiment of the present disclosure. As shown in FIG. 3, the first node control device 22 may further include a third switch device 223 electrically connected to the second node N2.

In a high level output phase, that is, in a phase in which the shift register 20 outputs a high level voltage signal, the first node N1 is at a cut-off level, the first switch device 221 is switched off, the third switch device 223 is configured to write a turn-on level into the second node N2, the second switch device 222 is switched on under control of the second node N2 and writes the cut-off level of the first power supply voltage signal terminal VGH into the first node N1.

The third switch device 223 is provided. In the high level output phase, the third switch device 223 writes the turn-on level into the second node N2, and the second switch device 222 is switched on. The cut-off level of the first power supply voltage signal terminal VGH is written into the first node N1 via the second switch device 222, and the first node N1 is at the cut-off level, and the first output device 21 is switched off, to avoid influencing normal output of the high level voltage signal due to the first clock signal of the first clock signal terminal XCK, and thus ensuring that the shift register 20 can output a stable high level voltage signal.

A circuit structure for outputting the high level voltage signal is not limited in the embodiments of the present disclosure. As shown in FIG. 3, in some examples, the shift register 20 may further include a second output device 23. A control terminal of the second output device 23 is electrically connected to the third node N3, a first terminal of the second output device 23 is electrically connected to the first power supply voltage signal terminal VGH, and a second terminal of the second output device 23 is electrically connected to the output terminal OUT of the shift register 20.

In the high level output phase, the second output device 23 is switched on under control of the third node N3, and transmits the high level voltage signal of the first power supply voltage signal terminal VGH to the output terminal OUT of the shift register 20, and the shift register 20 outputs a high level voltage signal.

It should be noted that, in some embodiments, in the high level output phase, the first clock signal terminal XCK may be controlled to provide a high level voltage signal, and a high level voltage signal is outputted via the first output device 21. Specific configurations are not limited in the embodiments of the present disclosure.

Figure 4:
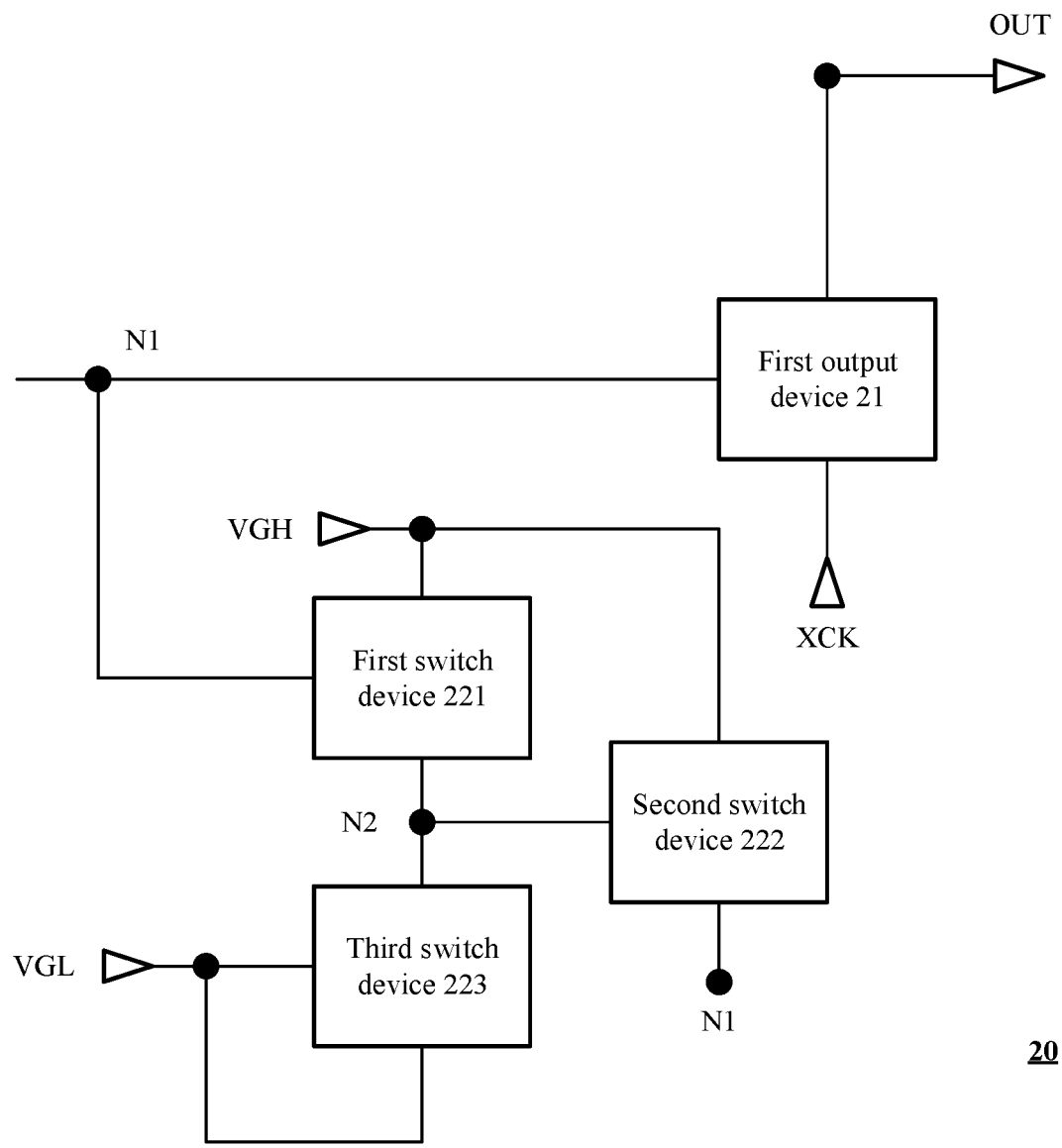
FIG. 4 is a schematic diagram of a circuit of a shift register according to another embodiment of the present disclosure.

FIG. 4 is a schematic diagram of a circuit of a shift register according to another embodiment of the present disclosure. As shown in FIG. 4, in some embodiments, both a control terminal and a first terminal of the third switch device 223 are electrically connected to a second power supply voltage signal terminal VGL, and a second terminal of the third switch device 223 is electrically connected to the second node N2.

In the high level output phase, the third switch device 223 is switched on under control of the second power supply voltage signal terminal VGL, and writes a turn-on level of the second power supply voltage signal terminal VGL into the second node N2. The second switch device 222 is switched on under control of the second node N2, and writes a cut-off level of the first power supply voltage signal terminal VGH into the first node N1, and the first node N1 is at the cut-off level.

In the embodiments of the present disclosure, description is made by assuming that the third switch device 223 is a P-type transistor, unless defined otherwise. When the third switch device 223 is the P-type transistor, the second power supply voltage signal terminal VGL may provide a second power supply voltage signal, and a voltage of the second power supply voltage signal is lower than 0V, that is, the second power supply voltage signal is a negative power supply voltage signal. Therefore, the third switch device 223 is switched on under control of the second power supply voltage signal terminal VGL. In the high level output phase, the first node N1 is at the cut-off level, the first switch device 221 is switched off, the third switch device 223 is switched on under control of the second power supply voltage signal terminal VGL, and writes a turn-on level (for example a low level) of the second power supply voltage signal terminal VGL into the second node N2, and the second switch device 222 is switched on. In this way, the cut-off level of the first power supply voltage signal terminal VGH is written into the first node N1 via the second switch device 222, and the first node N1 is at the cut-off level and the first output device 21 is switched off, to avoid influencing normal output of the high level voltage signal due to the first clock signal of the first clock signal terminal XCK and thus ensuring that the shift register 20 can output the stable high level voltage signal.

The control terminal and the first terminal of the third switch device 223 are connected to the same signal terminal, to reduce the number of signal terminals and wiring in the display panel, and thus being beneficial to simplify the wiring and reducing a production cost.

It is further found by the embodiments of the present disclosure that, in FIG. 4, the control terminal of the third switch device 223 is connected to the second power supply voltage signal terminal VGL and the second power supply voltage signal terminal VGL continuously outputs a negative power supply voltage signal (that is a turn-on level), so the third switch device 223 is always switched on. In the low level output phase, the second node N2 is required to be at a cut-off level, and the second switch device 222 is switched off under control of the second node N2. The third switch device 223 is always switched on, the turn-on level of the second power supply voltage signal terminal VGL is written into the second node N2 in the low level output phase, resulting in that the second node N2 cannot be at the cut-off level, and thus the second switch device 222 cannot be switched off thoroughly.

In view of this, an aspect ratio of a channel region of each of the first switch device 221 and the third switch device 223 is adjusted according to embodiments of the present disclosure, and the second node N2 can be at the cut-off level in the low level output phase and thus the second switch device 222 can be switched off thoroughly.

Figure 5:
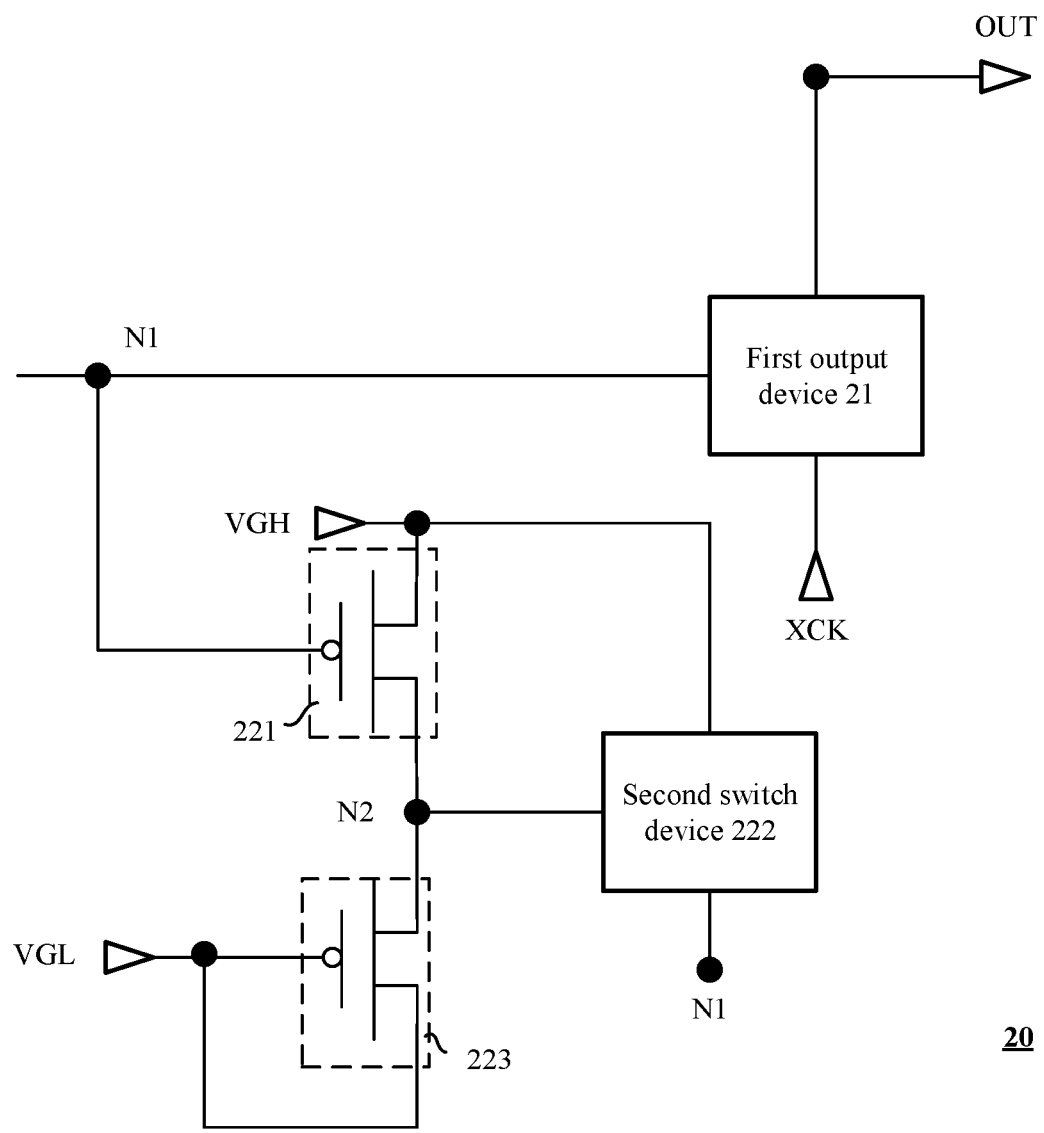
FIG. 5 is a schematic diagram of a circuit of a shift register according to another embodiment of the present disclosure.

FIG. 5 is a schematic diagram of a circuit of a shift register according to another embodiment of the present disclosure. As shown in FIG. 5, in some embodiments, the first switch device 221 and the third switch device 223 each include a transistor. In FIG. 5, the first switch device 221 and the third switch device 223 each are P-type transistors, for example. An aspect ratio W/L of a channel region of the first switch device 221 is greater than an aspect ratio W/L of a channel region of the third switch device 223.

In this way, in the low level output phase, the first switch device 221 and the third switch device 223 are switched on and the aspect ratio W/L of the channel region of the first switch device 221 is greater than the aspect ratio W/L of the channel region of the third switch device 223, the level written into the second node N2 mainly includes the cut-off level written by the first switch device 221, and the second node N2 is still at the cut-off level and thus the second switch device 222 can be switched off thoroughly.

Embodiments of the present disclosure show that, when a ratio of the aspect ratio W/L of the channel region of the first switch device 221 to the aspect ratio W/L of the channel region of the third switch device 223 is greater than or equal to 2, it can be ensured that the second node N2 can be at the cut-off level in the low level output phase, and thus the second switch device 222 can be switched off thoroughly.

In view of this, in some embodiments of the present disclosure, the ratio of the aspect ratio W/L of the channel region of the first switch device 221 to the aspect ratio W/L of the channel region of the third switch device 223 may be greater than or equal to 2. For example, in some examples, the ratio may be 2, 3, 5, . . . , 10 and so on.

In this way, in the low level output phase, the first switch device 221 and the third switch device 223 are switched on and the ratio of the aspect ratio W/L of the channel region of the first switch device 221 to the aspect ratio W/L of the channel region of the third switch device 223 is greater than or equal to 2, the level written into the second node N2 mainly includes the cut-off level written by the first switch device 221, and the second node N2 is still at the cut-off level and thus the second switch device 222 can be switched off thoroughly.

Figure 6:
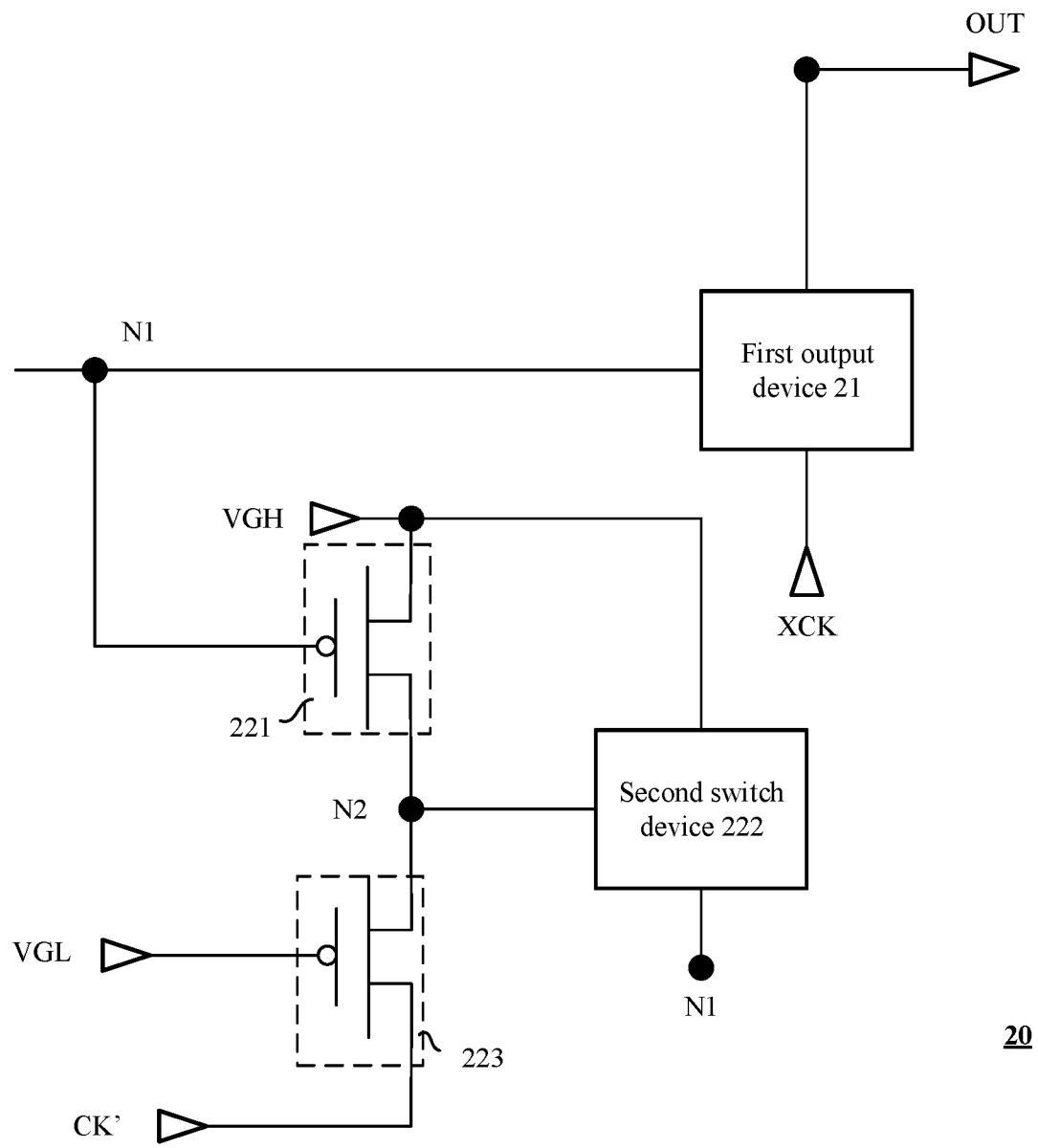
FIG. 6 is a schematic diagram of a circuit of a shift register according to another embodiment of the present disclosure.

FIG. 6 is a schematic diagram of a circuit of a shift register according to another embodiment of the present disclosure. The embodiment shown in FIG. 6 differs from the embodiment shown in FIG. 4 in that: the control terminal of the third switch device 223 is electrically connected to the second power supply voltage signal terminal VGL, the first terminal of the third switch device 223 is electrically connected to a second clock signal terminal CK', and the second terminal of the third switch device 223 is electrically connected to the second node N2.

In the high level output phase, the third switch device 223 is switched on under control of the second power supply voltage signal terminal VGL, and the turn-on level of the second clock signal terminal CK' is written into the second node N2.

The third switch device 223 may be always switched on under control of the second power supply voltage signal terminal VGL. In the high level output phase, the first node N1 is at the cut-off level, the first switch device 221 is switched off, the second clock signal terminal CK' provides a turn-on level, and the third switch device 223 writes the turn-on level of the second clock signal terminal CK' into the second node N2, and the second switch device 222 is switched on. In this way, the cut-off level of the first power supply voltage signal terminal VGH is written into the first node N1 via the second switch device 222, and the first node N1 is at the cut-off level and the first output device 21 can be switched off, to avoid influencing normal output of the high level voltage signal due to the first clock signal of the first clock signal terminal XCK and thus ensuring that the shift register 20 can output the stable high level voltage signal.

Referring to FIG. 6, in some embodiments of the present disclosure, in the low level output phase, the third switch device 223 is switched on under control of the second power supply voltage signal terminal VGL, and the cut-off level of the second clock signal terminal CK' is written into the second node N2.

In the low level output phase, the first switch device 221 is switched on under control of the first node N1, and the cut-off level of the first power supply voltage signal terminal VGH is written into the second node N2. In addition, the second clock signal terminal CK' provides a cut-off level, and the third switch device 223 writes the cut-off level of the second clock signal terminal CK' into the second node N2.

In the low level output phase, not only the first switch device 221 writes the cut-off level of the first power supply voltage signal terminal VGH into the second node N2, but also the third switch device 223 writes the cut-off level of the second clock signal terminal CK' into the second node N2, and the second node N2 can be at the cut-off level and the second switch device 222 can be switched off thoroughly under control of the second node N2, to ensure that the shift register 20 can output the stable low level voltage signal to a great extent.

It should be noted that, the voltage of the cut-off level of the first power supply voltage signal terminal VGH and the voltage of the cut-off level of the second clock signal terminal CK' may be adjusted flexibly depending on actual cases, and the voltages are not limited in the embodiments of the present disclosure.

In some embodiments, the voltage of the cut-off level of the second clock signal terminal CK' may be lower than the voltage of the cut-off level of the first power supply voltage signal terminal VGH, to reduce a power consumption. In another embodiments, the voltage of the cut-off level of the second clock signal terminal CK' may be higher than or equal to the voltage of the cut-off level of the first power supply voltage signal terminal VGH, and the cut-off level with a higher voltage can be written into the second node N2, and thus the second switch device 222 can be switched off thoroughly.

Figure 7:
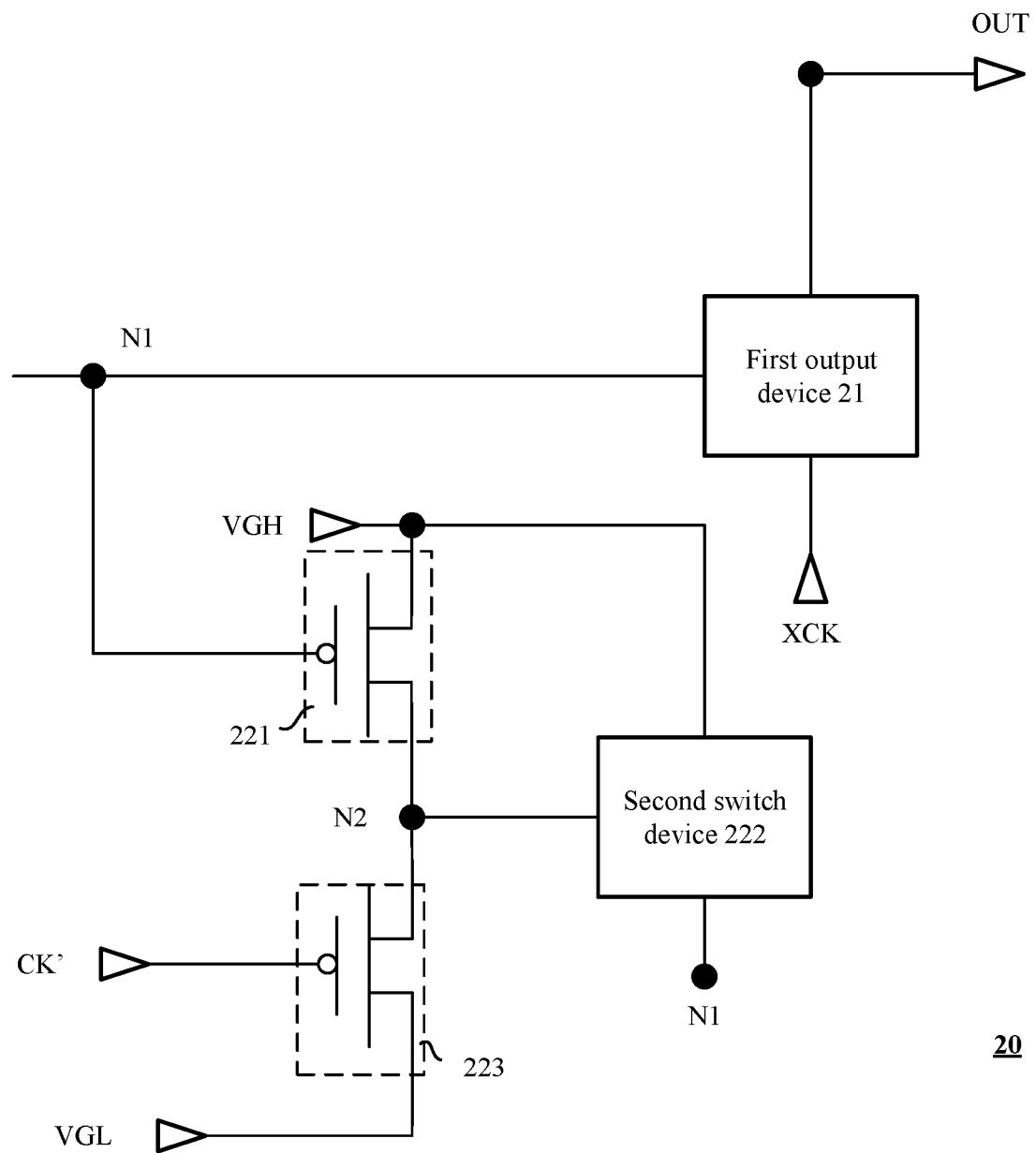
FIG. 7 is a schematic diagram of a circuit of a shift register according to another embodiment of the present disclosure.

FIG. 7 is a schematic diagram of a circuit of a shift register according to another embodiment of the present disclosure. The embodiment shown in FIG. 7 differs from the embodiments shown in FIG. 4 and FIG. 6 in that: the control terminal of the third switch device 223 is electrically connected to the second clock signal terminal CK', the first terminal of the third switch device 223 is electrically connected to the second power supply voltage signal terminal VGL, and the second terminal of the third switch device 223 is electrically connected to the second node N2.

In the high level output phase, the third switch device 223 is switched on under control of the second clock signal terminal CK', and the turn-on level of the second power supply voltage signal terminal VGL is written into the second node N2.

In the high level output phase, the first node N1 is at the cut-off level, the first switch device 221 is switched off, the second clock signal terminal CK' provides a turn-on level, the third switch device 223 is switched on under control of the second clock signal CK', and the third switch device 223 writes the turn-on level of the second power supply voltage signal terminal VGL into the second node N2, and the second switch device 222 is switched on. In this way, the cut-off level of the first power supply voltage signal terminal VGH is written into the first node N1 via the second switch device 222, and the first node N1 is at the cut-off level and the first output device 21 can be switched off, to avoid influencing normal output of the high level voltage signal due to the first clock signal of the first clock signal terminal XCK and thus ensuring that the shift register 20 can output the stable high level voltage signal.

Referring to FIG. 7, in some embodiments of the present disclosure, in the low level output phase, the second clock signal terminal CK' may provide a cut-off level, and the third switch device 223 is switched off under control of the second clock signal terminal CK'.

In this way, the third switch device 223 is switched off, the turn-on level of the second power supply voltage signal terminal VGL cannot be written into the second node N2, and the second node N2 is at the cut-off level in the low level output phase and thus the second switch device 222 is switched off under control of the second node N2, to ensure that the shift register 20 can output the stable low level voltage signal.

Figure 8:
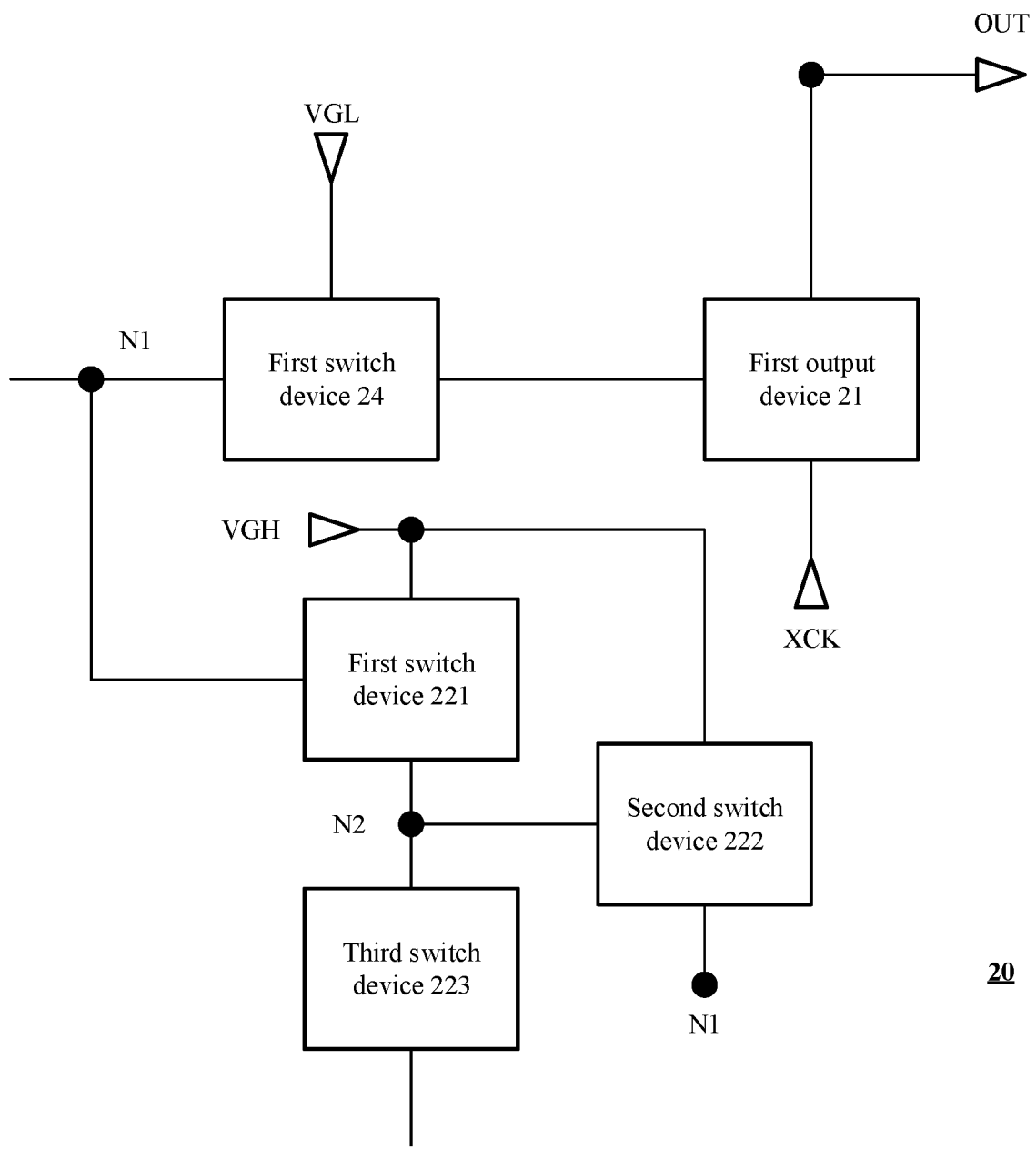
FIG. 8 is a schematic diagram of a circuit of a shift register according to another embodiment of the present disclosure.

FIG. 8 is a schematic diagram of a circuit of a shift register according to another embodiment of the present disclosure. As shown in FIG. 8, in some embodiments of the present disclosure, a first switch device 24 is connected between the first node N1 and the control terminal of the first output device 21. The shift register 20 may further include the first switch device 24. A control terminal of the first switch device 24 is electrically connected to the second power supply voltage signal terminal VGL, a first terminal of the first switch device 24 is electrically connected to the first node N1, and a second terminal of the first switch device 24 is electrically connected to the control terminal of the first output device 21.

In some embodiments, the first switch device 24 may be a transistor. Since the second power supply voltage signal terminal VGL continuously outputs the second power supply voltage signal (that is, the turn-on level), the first switch device 24 is switched on at most of time. In the low level output phase, a potential of the control terminal of the first output device 21 is pulled down to a lower potential. Due to the switch on/off characteristics of the transistor, when a difference between a voltage Vg of the control terminal of the first switch device 24 and a voltage Vs of the second terminal of the first switch device 24 is less than or equal to an absolute value $|V_{th}|$ of a threshold voltage of the first switch device 24, that is, $V_g-V_s=|V_{th}|$, the first switch device 24 is switched off, and the potential of the first node N1 is no longer pulled down, to reduce a voltage difference between a gate and a drain or a voltage difference between a gate and a source of transistors connected to the first node N1, and thus improving circuit stability.

Figure 9:
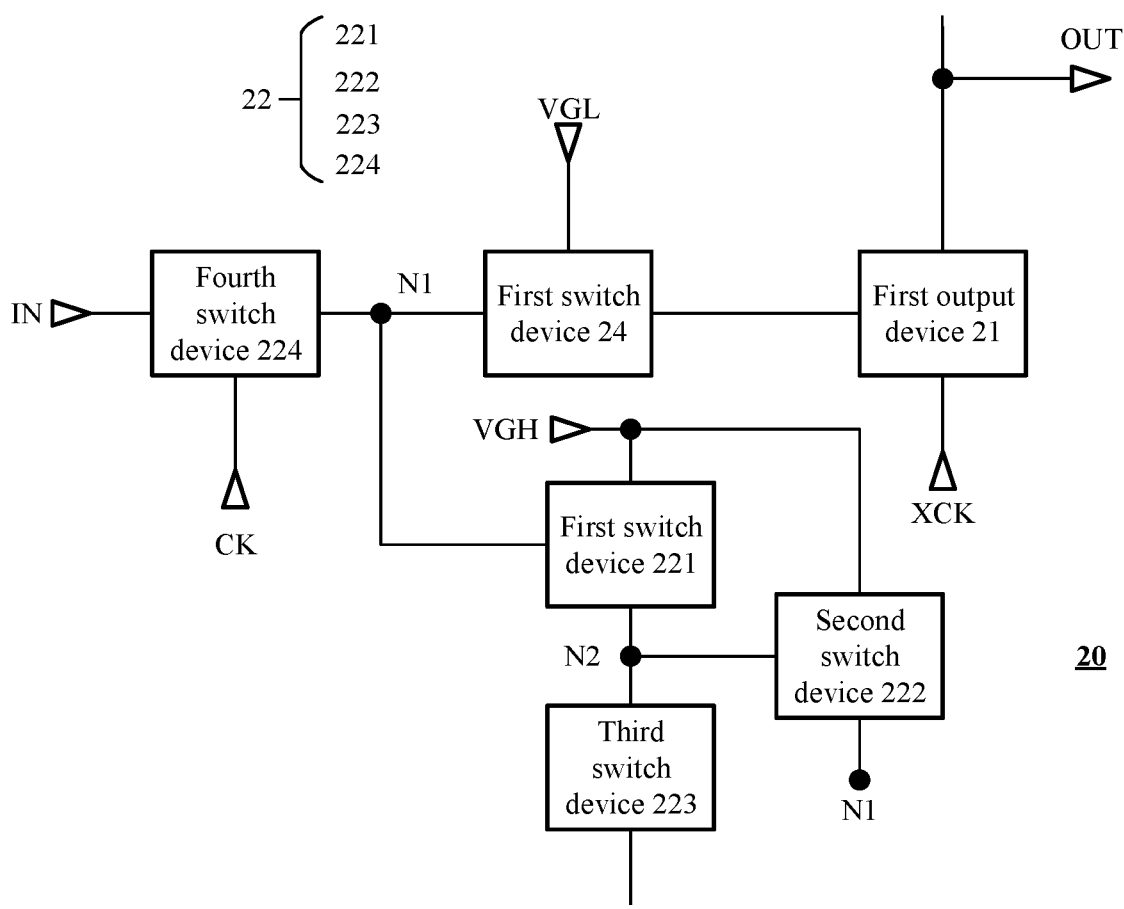
FIG. 9 is a schematic diagram of a circuit of a shift register according to another embodiment of the present disclosure.

FIG. 9 is a schematic diagram of a circuit of a shift register according to another embodiment of the present disclosure. As shown in FIG. 9, in some embodiments of the present disclosure, the first node control device 22 may further include a fourth switch device 224. A control terminal of the fourth switch device 224 is electrically connected to a third clock signal terminal CK, a first terminal of the fourth switch device 224 is electrically connected to an input terminal IN of the shift register, and a second terminal of the fourth switch device 224 is electrically connected to the first node N1. The fourth switch device 224 may be configured to write a turn-on level or a cut-off level of the input terminal IN of the shift register into the first node N1 under control of the third clock signal terminal CK. For example, in the low level output phase, the fourth switch device 224 may write the turn-on level of the input terminal IN of the shift register into the first node N1 under control of the third clock signal terminal CK. In another example, in the high level output phase, the fourth switch device 224 writes the cut-off level of the input terminal IN of the shift register into the first node N1 under control of the third clock signal terminal CK.

That is, the fourth switch device 224 is configured to control a potential of the first node N1, that is, controlling the first node N1 to be at a turn-on level or a cut-off level.

Figure 10:
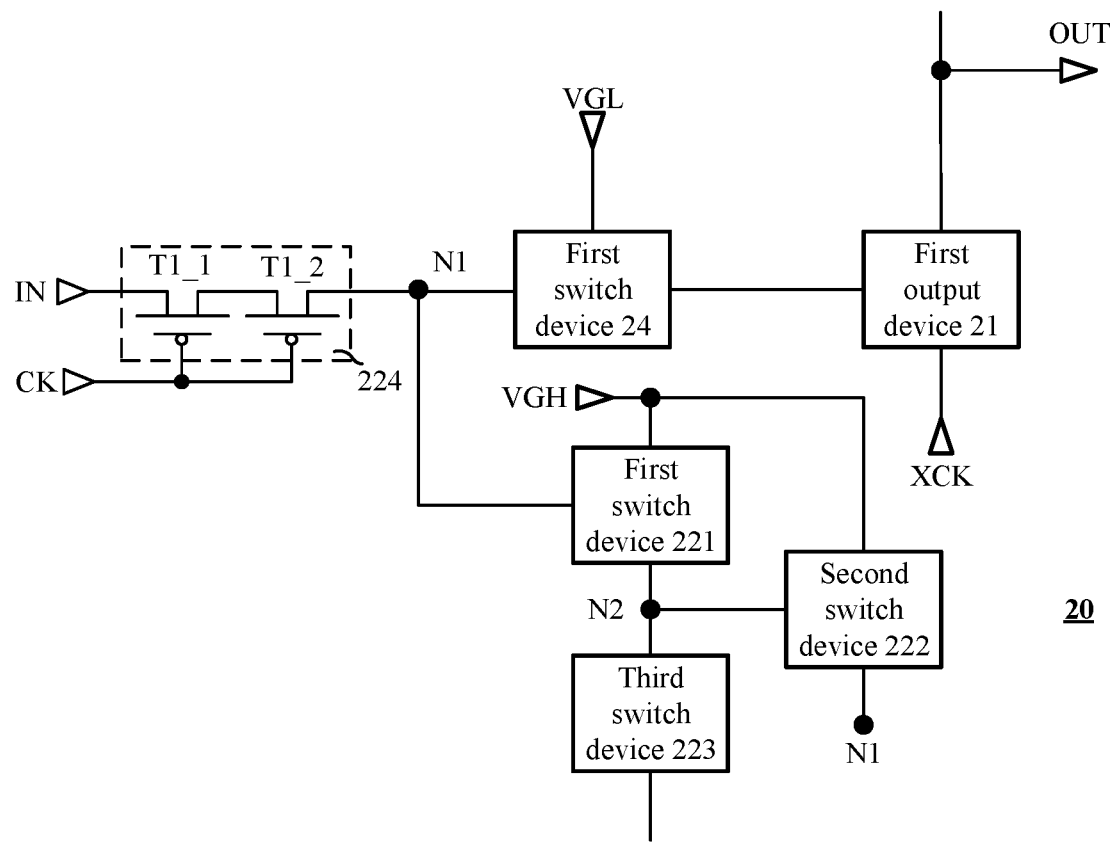
FIG. 10 is a schematic diagram of a circuit of a shift register according to another embodiment of the present disclosure.

FIG. 10 is a schematic diagram of a circuit of a shift register according to another embodiment of the present disclosure. As shown in FIG. 10, in some embodiments, the fourth switch device 224 may include a first sub-transistor T1_1 and a second sub-transistor T1_2 connected in series, that is, a double-gate transistor. A gate of the first sub-transistor T1_1 and a gate of the second sub-transistor T1_2 each are electrically connected to the third clock signal terminal CK. A first pole of the first sub-transistor T1_1 is electrically connected to the input terminal IN of the shift register, a second pole of the first sub-transistor T1_1 is electrically connected to a first pole of the second sub-transistor T1_2, and a second pole of the second sub-transistor T1_2 is electrically connected to the first node N1.

When the third clock signal terminal CK transmits a turn-on level, the first sub-transistor T1_1 and the second sub-transistor T1_2 are switched on, and the turn-on level or the cut-off level of the input terminal IN of the shift register are written into the first node N1 via the switched on first sub-transistor T1_1 and second sub-transistor T1_2 successively.

The fourth switch device 224 is a double-gate transistor, and a leakage current of the first node N1 can be reduced to maintain stability of the potential of the first node N1, and thus the shift register outputs a stable voltage signal.

Figure 11:
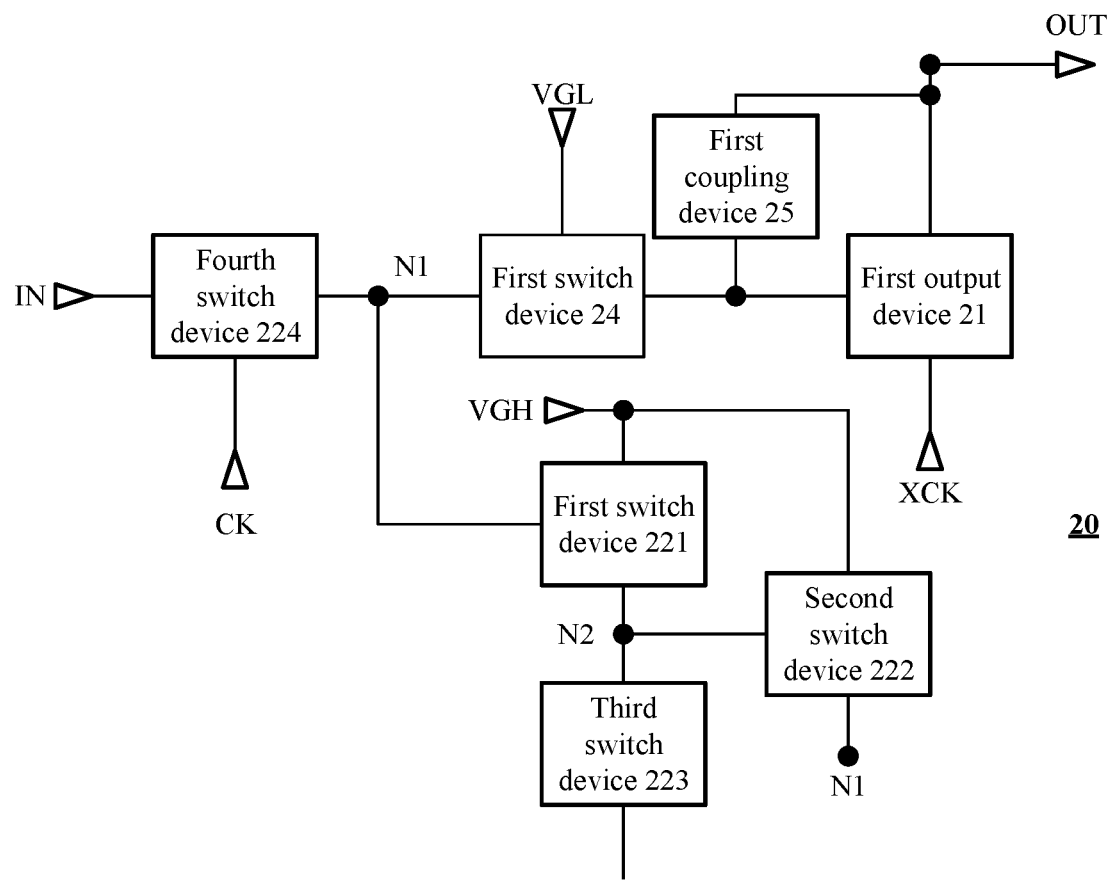
FIG. 11 is a schematic diagram of a circuit of a shift register according to another embodiment of the present disclosure.

FIG. 11 is a schematic diagram of a circuit of a shift register according to another embodiment of the present disclosure. As shown in FIG. 11, in some embodiments of the present disclosure, the shift register 20 may further include a first coupling device 25. A first terminal of the first coupling device 25 is electrically connected to an output terminal OUT of the shift register, and a second terminal of the first coupling device 25 is electrically connected to the control terminal of the first output device 21.

In the low level output phase, output of the output terminal OUT of the shift register is switched from a high level to a low level, so the first coupling device 25 performs coupling. Under the coupling function of the first coupling device 25, the potential of the control terminal of the first output device 21 is further pulled down, and the first output device 21 is opened thoroughly, and thus the output terminal OUT of the shift register outputs a low level with a lower potential.

In the high level output phase, output of the output terminal OUT of the shift register is switched from a low level to a high level, so the first coupling device 25 performs coupling. Under the coupling function of the first coupling device 25, the potential of the control terminal of the first output device 21 is further pulled up, and the first output device 21 is switched off thoroughly, and thus the output terminal OUT of the shift register outputs a stable high level voltage signal.

Figure 12:
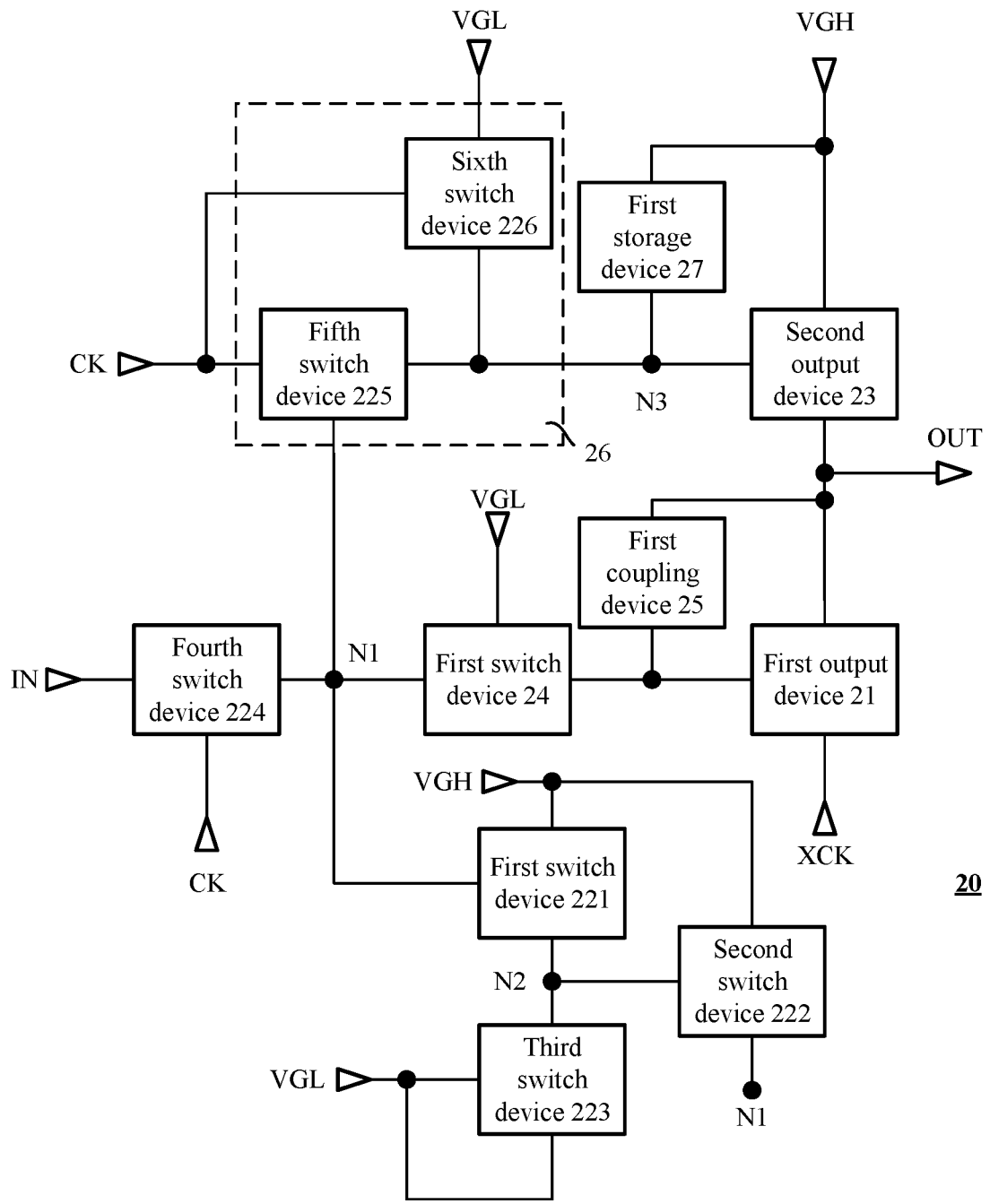
FIG. 12 is a schematic diagram of a circuit of a shift register according to another embodiment of the present disclosure.

FIG. 12 is a schematic diagram of a circuit of a shift register according to another embodiment of the present disclosure. As shown in FIG. 12, the shift register 20 may further include a second output device 23. A control terminal of the second output device 23 is electrically connected to the third node N3, a first terminal of the second output device 23 is electrically connected to the first power supply voltage signal terminal VGH, and a second terminal of the second output device 23 is electrically connected to the output terminal OUT of the shift register 20. In the high level output phase, the second output device 23 is switched on under control of the third node N3, and transmits a high level voltage signal of the first power supply voltage signal terminal VGH to the output terminal OUT of the shift register 20, and the shift register 20 outputs the high level voltage signal.

Referring to FIG. 12, in some embodiments of the present disclosure, the shift register 20 may further include a third node control device 26. The third node control device 26 may include a fifth switch device 225 and a sixth switch device 226. A control terminal of the fifth switch device 225 is electrically connected to the first node N1, a first terminal of the fifth switch device 225 is electrically connected to the third clock signal terminal CK, and a second terminal of the fifth switch device 225 is electrically connected to the third node N3. A control terminal of the sixth switch device 226 is electrically connected to the third clock signal terminal CK, a first terminal of the sixth switch device 226 is electrically connected to the second power supply voltage signal terminal VGL, and a second terminal of the sixth switch device 226 is electrically connected to the third node N3.

When the first node N1 is at a turn-on level, the fifth switch device 225 is switched on under control of the first node N1, and writes the turn-on level or cut-off level of the third clock signal terminal CK into the third node N3. When the third clock signal terminal CK is at a turn-on level, the sixth switch device 226 is switched on under control of the third clock signal terminal CK, and writes the turn-on level of the second power supply voltage signal terminal VGL into the third node N3. That is, the fifth switch device 225 and the sixth switch device 226 are configured to mainly control a potential of the third node N3.

Referring to FIG. 12, in some embodiments of the present disclosure, the shift register 20 may further include a first storage device 27. A first terminal of the first storage device 27 is electrically connected to the output terminal OUT of the shift register, and a second terminal of the first storage device 27 is electrically connected to the control terminal (that is, the third node N3) of the second output device 23. The first storage device 27 is configured to maintain the potential of the third node N3.

For facilitating understanding, a work process of the shift register is described in conjunction with some application embodiments.

Figure 13:
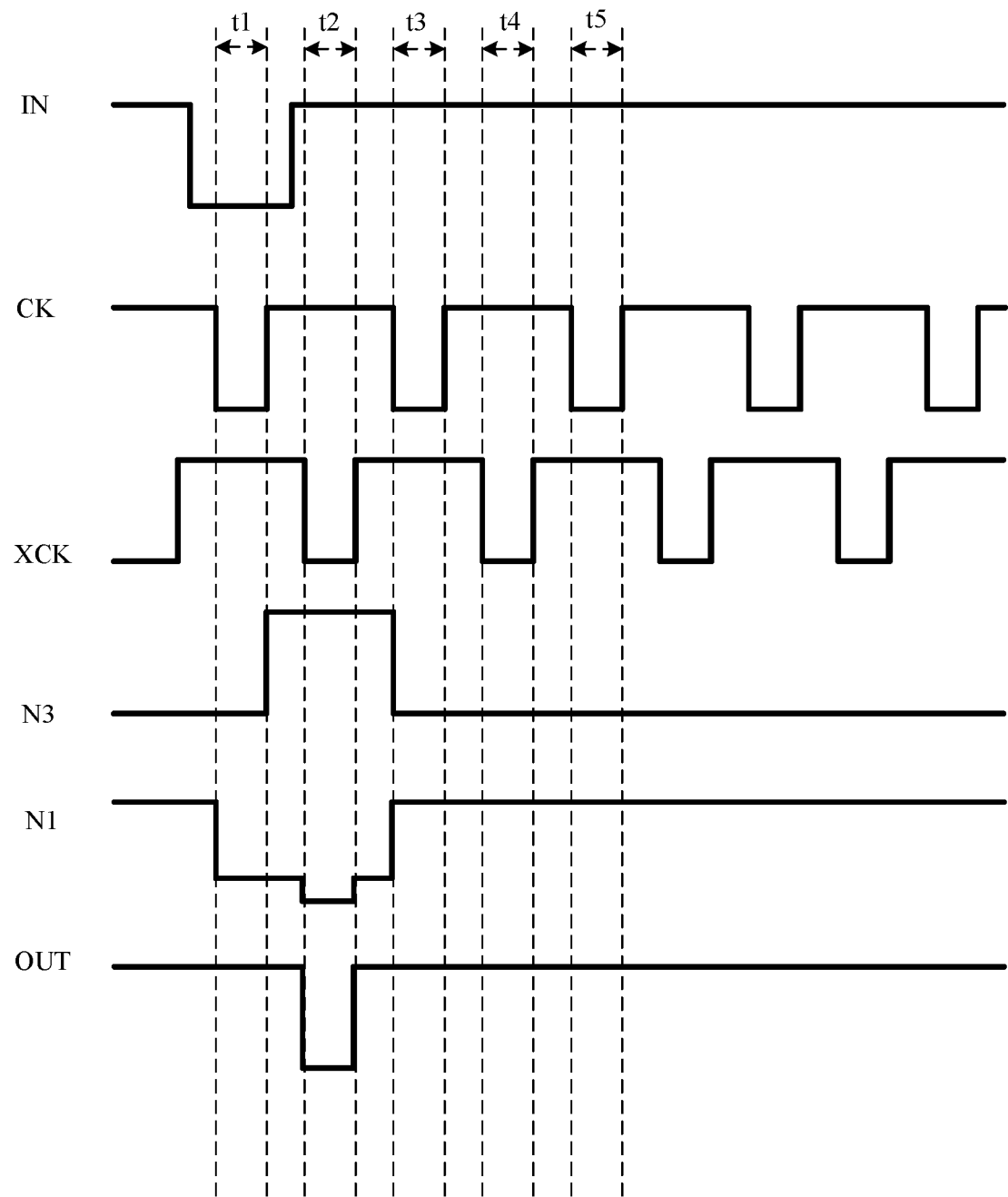
FIG. 13 is a schematic diagram showing a driving time sequence corresponding to the shift register shown in FIG. 12.

FIG. 13 is a schematic diagram showing a driving time sequence of the shift register shown in FIG. 12. With reference to FIG. 12 and FIG. 13, in some embodiments of the present disclosure, one duty cycle of the shift register 20 may include phases t1 to t5. Phases t1, t3, t4 and t5 are high level output phases, and phase t2 is a low level output phase. For facilitating illustration, phase t1 is referred to as a first high level output phase, phase t3 is referred to as a second high level output phase, phase t4 is referred to as a third high level output phase, and phase t5 is referred to as a fourth high level output phase.

In the first high level output phase t1, the third clock signal terminal CK and the input terminal IN of the shift register provide a turn-on level, and the first clock signal terminal XCK provides a cut-off level. The fourth switch device 224 is switched on in response to the turn-on level of the third clock signal terminal CK, and writes the turn-on level of the input terminal IN of the shift register into the first node N1. The first output device 21 is switched on in response to the turn-on level of the first node N1, and transmits the high level of the first clock signal terminal XCK into the output terminal OUT of the shift register. The fifth switch device 225 is switched on in response to the turn-on level of the first node N1, and transmits the turn-on level of the third clock signal terminal CK into the third node N3. The second output device 23 is switched on in response to the turn-on level of the third node N3, and transmits the high level of the first power supply voltage signal terminal VGH to the output terminal OUT of the shift register.

With reference to the embodiments shown in FIG. 4 and FIG. 12, in the first high level output phase t1, the first switch device 221 is switched on under control of the first node N1, and writes the cut-off level of the first power supply voltage signal terminal VGH into the second node N2. The third switch device 223 is always switched on, and the third switch device 223 writes the turn-on level of the second power supply voltage signal terminal VGL into the second node N2. The aspect ratio W/L of the channel region of the first switch device 221 is greater than the aspect ratio W/L of the channel region of the third switch device 223, the level written into the second node N2 mainly includes the cut-off level written by the first switch device 221, and the second node N2 is at the cut-off level and the second switch device 222 is switched off under control of the second node N2.

In the low level output phase t2, the first clock signal terminal XCK provides a turn-on level and the third clock signal terminal CK and the input terminal IN of the shift register provide a cut-off level. The fourth switch device 224 is switched off in response to the cut-off level of the third clock signal terminal CK, and the first node N1 maintains the turn-on level. The fifth switch device 225 is switched on in response to the turn-on level of the first node N1, and transmits the cut-off level of the third clock signal terminal CK to the third node N3. The second output device 23 is switched off in response to the cut-off level of the third node N3. The first output device 21 is switched on in response to the turn-on level of the first node N1, and transmits the low level of the first clock signal terminal XCK to the output terminal OUT of the shift register.

With reference to the embodiments shown in FIG. 4 and FIG. 12, in the low level output phase t2, the first switch device 221 is switched on under control of the first node N1, and writes the cut-off level of the first power supply voltage signal terminal VGH into the second node N2. The third switch device 223 is always switched on, and the third switch device 223 writes the turn-on level of the second power supply voltage signal terminal VGL into the second node N2. The aspect ratio W/L of the channel region of the first switch device 221 is greater than the aspect ratio W/L of the channel region of the third switch device 223, the level written into the second node N2 mainly includes the cut-off level written by the first switch device 221, and the second node N2 is at the cut-off level and the second switch device 222 is switched off under control of the second node N2.

In the second high level output phase t3, the third clock signal terminal CK provides a turn-on level, and the first clock signal terminal XCK and the input terminal IN of the shift register provides a cut-off level. The fourth switch device 224 is switched on in response to the turn-on level of the third clock signal terminal CK, and writes the cut-off level of the input terminal IN of the shift register into the first node N1. The first output device 21 is switched off in response to the cut-off level of the first node N1. The sixth switch device 226 is switched on in response to the turn-on level of the third clock signal terminal CK, and transmits the turn-on level of the second power supply voltage signal terminal VGL into the third node N3. The second output device 23 is switched on in response to the turn-on level of the third node N3, and transmits the high level of the first power supply voltage signal terminal VGH to the output terminal OUT of the shift register.

With reference to the embodiments shown in FIG. 4 and FIG. 12, in the second high level output phase t3, the first node N1 is at the cut-off level, the first switch device 221 is switched off, and the third switch device 223 is switched on under control of the second power supply voltage signal terminal VGL and writes the turn-on level (for example a low level) of the second power supply voltage signal terminal VGL into the second node N2, and the second switch device 222 is switched on. In this way, the cut-off level of the first power supply voltage signal terminal VGH is written into the first node N1 via the second switch device 222, and the first node N1 is at the cut-off level, and the first output device 21 is switched off, to avoid influencing normal output of the high level voltage signal due to the first clock signal of the first clock signal terminal XCK, and thus ensuring that the shift register 20 can output a stable high level voltage signal.

In the third high level output phase t4, the first clock signal terminal XCK provides a turn-on level, and the third clock signal terminal CK and the input terminal IN of the shift register provides a cut-off level. The fourth switch device 224 is switched off in response to the turn-off level of the third clock signal terminal CK, and the first coupling device 25 maintains the cut-off level of the first node N1. The first output device 21 is switched off in response to the cut-off level of the first node N1. The first output device 21 is switched off in response to the cut-off level of the first node N1. The first storage device 27 maintains the turn-on level of the third node N3. The second output device 23 is switched on in response to the turn-on level of the third node N3, and transmits the high level of the first power supply voltage signal terminal VGH to the output terminal OUT of the shift register.

With reference to the embodiments shown in FIG. 4 and FIG. 12, in the third high level output phase t4, the first node N1 is at the cut-off level, the first switch device 221 is switched off, and the third switch device 223 is switched on under control of the second power supply voltage signal terminal VGL and writes the turn-on level (for example a low level) of the second power supply voltage signal terminal VGL into the second node N2, and the second switch device 222 is switched on. In this way, the cut-off level of the first power supply voltage signal terminal VGH is written into the first node N1 via the second switch device 222, and the first node N1 is at the cut-off level, and the first output device 21 is switched off, to avoid influencing normal output of the high level voltage signal due to the first clock signal of the first clock signal terminal XCK, and thus ensuring that the shift register 20 can output a stable high level voltage signal.

In the fourth high level output phase t5, the third clock signal terminal CK provides a turn-on level, and the first clock signal terminal XCK and the input terminal IN of the shift register provide a cut-off level. The fourth switch device 224 is switched on in response to the turn-off level of the third clock signal terminal CK, and writes the cut-off level of the input terminal IN of the shift register into the first node N1. The first output device 21 is switched off in response to the cut-off level of the first node N1. The first storage device 27 maintains the turn-on level of the third node N3. The second output device 23 is switched on in response to the turn-on level of the third node N3, and transmits the high level of the first power supply voltage signal terminal VGH to the output terminal OUT of the shift register.

With reference to the embodiments shown in FIG. 4 and FIG. 12, in the fourth high level output phase t5, the first node N1 is at the cut-off level, the first switch device 221 is switched off, and the third switch device 223 is switched on under control of the second power supply voltage signal terminal VGL and writes the turn-on level (for example a low level) of the second power supply voltage signal terminal VGL into the second node N2, and the second switch device 222 is switched on. In this way, the cut-off level of the first power supply voltage signal terminal VGH is written into the first node N1 via the second switch device 222, and the first node N1 is at the cut-off level, and the first output device 21 is switched off, to avoid influencing normal output of the high level voltage signal due to the first clock signal of the first clock signal terminal XCK, and thus ensuring that the shift register 20 can output a stable high level voltage signal.

Figures 14, 15:
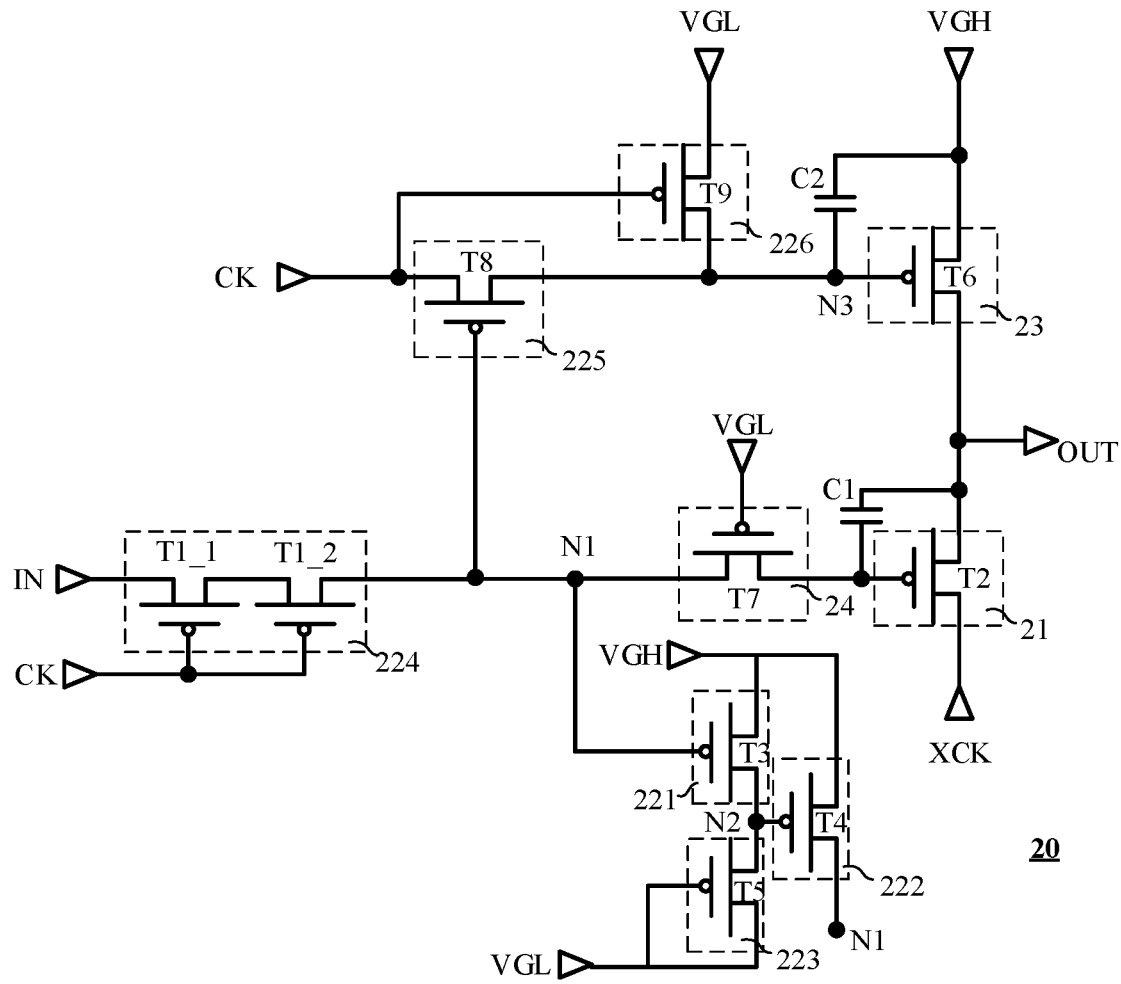
FIG. 14 is a schematic diagram of a circuit of a shift register according to another embodiment of the present disclosure.
FIG. 15 is a schematic flowchart of a method for driving a shift register according to an embodiment of the present disclosure.

FIG. 14 is a schematic diagram of a circuit of a shift register according to another embodiment of the present disclosure. As shown in FIG. 12 and FIG. 14, in some embodiments of the present disclosure, the fourth switch device 224 may include a first sub-transistor T1_1 and a second sub-transistor T1_2 connected in series. The first output device 21 may include a second transistor T2, the first switch device 221 may include a third transistor T3, the second switch device 222 may include a fourth transistor T4, the third switch device 223 may include a fifth transistor T5, the second output device 23 may include a sixth transistor T6, the first switch device 24 may include a seventh transistor T7, the fifth switch device 225 may include an eighth transistor T8, the sixth switch device 226 may include a ninth transistor T9, the first coupling device 25 may include a first coupling capacitor C1, and the first storage device 27 may include a first storage capacitor C2.

For connection of the transistors and capacitors, one may refer to FIG. 14 and the above description of connection of various devices, and details are not repeated herein. For the work process of the transistors and capacitors in FIG. 14, one may refer to the description of the driving time sequence in conjunction with FIG. 12 and FIG. 13, and details are not repeated herein.

Corresponding to the shift register 20 provided in the above embodiments, a method for driving a shift register is further provided according to embodiments of the present disclosure. The method may be applied to the shift register 20 provided in the above embodiments.

FIG. 15 is a schematic flowchart of a method for driving a shift register according to an embodiment of the present disclosure. As shown in FIG. 15, the method for driving a shift register according to the embodiment of the present disclosure includes step S101 as follows.

In step S101, in a low level output phase, a turn-on level is provided to a first node, and a first switch device is switched on under control of the first node and writes a cut-off level of a first power supply voltage signal terminal to a second node, and a second switch device is switched off under control of the second node.

For specific process of step S101, one may refer to the above description, and details are not repeated herein.

According to the method for driving a shift register in the embodiment of the present disclosure, in the low level output phase, the first switch device is switched on under control of the first node, and writes the cut-off level of the first power supply voltage signal terminal into the second node, and the second switch device is switched off under control of the second node. In this way, the cut-off level of the first power supply voltage signal terminal can be prevented from being transmitted to the first node via the second switch device, to avoid influencing the level of the first node and thus outputting a stable low level voltage signal. In addition, neither the first switch device nor the second switch device is connected to the clock signal terminal, to avoid influencing the first node due to jumping of a clock signal transmitted by the clock signal terminal and thus outputting the stable low level voltage signal.

In some embodiments of the present disclosure, the first node control device further includes a third switch device electrically connected to the second node.

Figure 16:
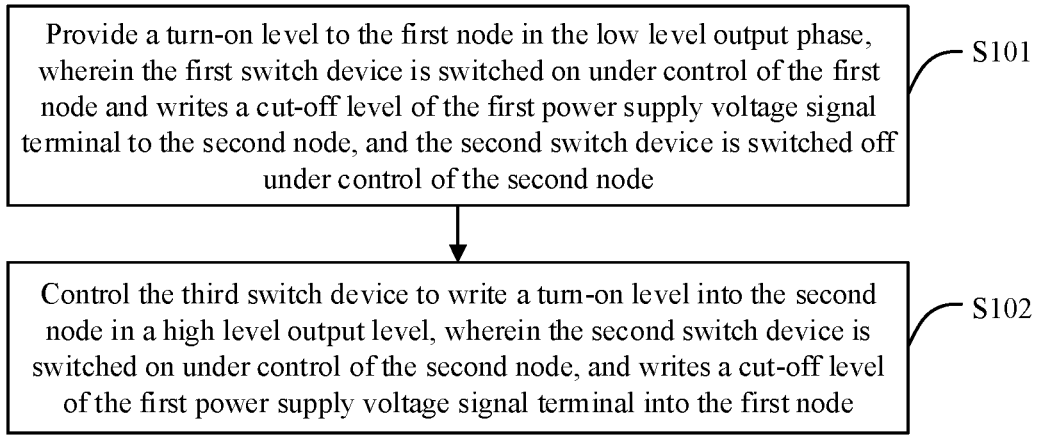
FIG. 16 is a schematic flowchart of a method for driving a shift register according to another embodiment of the present disclosure.

FIG. 16 is a schematic flowchart of the method for driving a shift register according to another embodiment of the present disclosure. As shown in FIG. 16, the method further includes step S102 as follows.

In step S102, in a high level output phase, the third switch device is controlled to write the turn-on level into the second node, and the second switch device is switched on under control of the second node, and writes the cut-off level of the first power supply voltage signal terminal into the first node.

For specific process of step S102, one may refer to the above description, and details are not repeated herein.

According to some embodiments of the present disclosure, the first node control device further includes a fourth switch device. A control terminal of the fourth switch device is electrically connected to a third clock signal terminal, a first terminal of the fourth switch device is electrically connected to an input terminal of the shift register, and a second terminal of the fourth switch device is electrically connected to the first node.

The shift register further includes a second output device, a third node control device, a first coupling device and a first storage device. A control terminal of the second output device is electrically connected to a third node, a first terminal of the second output device is electrically connected to the first power supply voltage signal terminal, a second terminal of the second output device is electrically connected to an output terminal of the shift register.

The third node control device includes a fifth switch device and a sixth switch device. A control terminal of the fifth switch device is electrically connected to the first node, a first terminal of the fifth switch device is electrically connected to a third clock signal terminal, and a second terminal of the fifth switch device is electrically connected to the third node. A control terminal of the sixth switch device is electrically connected to the third clock signal terminal, a first terminal of the sixth switch device is electrically connected to a second power supply voltage signal terminal, and a second terminal of the sixth switch device is electrically connected to the third node.

A first terminal of the first coupling device is electrically connected to an output terminal of the shift register, and a second terminal of the first coupling device is electrically connected to the control terminal of the first output device.

A first terminal of the first storage device is electrically connected to the output terminal of the shift register, and a second terminal of the first storage device is electrically connected to the control terminal of the second output device.

The high level output phase includes a first high level output phase before the low level output phase. In the first high level output phase, a turn-on level is provided to the third clock signal terminal and the input terminal of the shift register, and a cut-off level is provided to the first clock signal terminal. The fourth switch device is switched on in response to the turn-on level of the third clock signal terminal and writes a turn-on level of the input terminal of the shift register into the first node. The first output device is switched on in response to the turn-on level of the first node and transmits a high level of the first clock signal terminal to the output terminal of the shift register. The fifth switch device is switched on in response to the turn-on level of the first node and transmits the turn-on level of the third clock signal terminal to the third node; and the second output device is switched on in response to a turn-on level of the third node, and transmits a high level of the first power supply voltage signal terminal to the output terminal of the shift register.

For specific process of the first high level output phase, one may refer to the above description, and details are not repeated herein.

In some embodiments of the present disclosure, the high level output phase further includes at least one of a second high level output phase, a third high level output phase and a fourth high level output phase after the low level output phase.

In the second high level output phase, a turn-on level is provided to the third clock signal terminal and a cut-off level is provided to the first clock signal terminal and the input terminal of the shift register. The fourth switch device is switched on in response to a turn-on level of the third clock signal terminal and writes a cut-off level of the input terminal of the shift register into the first node. The first output device is switched off in response to a cut-off level of the first node. The sixth switch device is switched on in response to a turn-on level of the third clock signal terminal and transmits a turn-on level of the second power supply voltage signal terminal to the third node. The second output device is switched on in response to a turn-on level of the third node, and transmits a high level of the first power supply voltage signal terminal to an output terminal of the shift register.

In the third high level output level, a turn-on level is provided to the first clock signal terminal and a cut-off level is provided to the third clock signal terminal and the input terminal of the shift register. The fourth switch device is switched off in response to the cut-off level of the third clock signal terminal. The first coupling device maintains the cut-off level of the first node. The first output device is switched off in response to the cut-off level of the first node. The first storage device maintains the turn-on level of the third node. The second output device is switched on in response to the turn-on level of the third node, and transmits the high level of the first power supply voltage signal terminal to the output terminal of the shift register.

In the fourth high level output level, a turn-on level is provided to the third clock signal terminal and a cut-off level is provided to the first clock signal terminal and the input terminal of the shift register. The fourth switch device is switched on in response to the turn-on level of the third clock signal terminal and writes the cut-off level of the input terminal of the shift register into the first node. The first output device is switched off in response to the cut-off level of the first node. The first storage device maintains the turn-on level of the third node. The second output device is switched on in response to the turn-on level of the third node and transmits the high level of the first power supply voltage signal terminal to the output terminal of the shift register.

For specific process of the second high level output phase, the third high level output phase and the fourth high level output phase, one may refer to the above detailed description, and details are not repeated herein.

Corresponding to the shift register 20 in the above embodiments, a gate driving circuit is further provided according to embodiments of the present disclosure.

Figure 17:
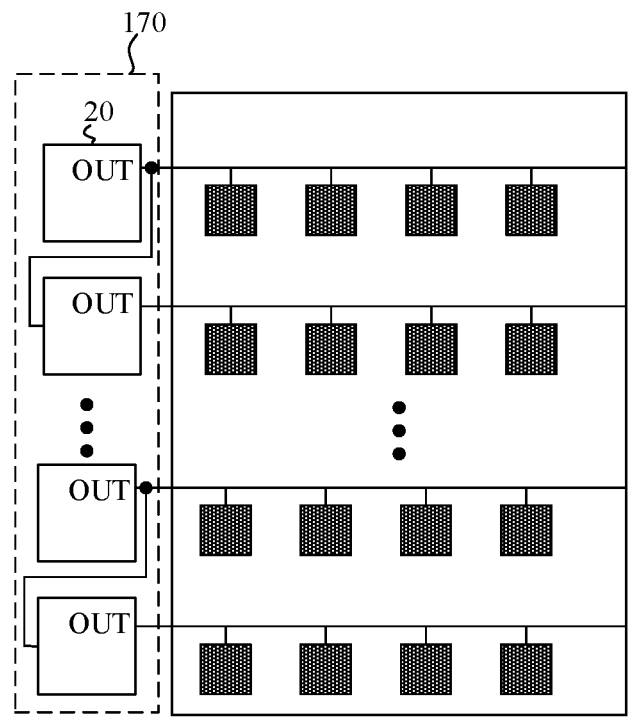
FIG. 17 is schematic diagram of a gate driving circuit according to an embodiment of the present disclosure.

FIG. 17 is a schematic diagram of a gate driving circuit according to an embodiment of the present disclosure. As shown in FIG. 17, the gate driving circuit 170 in this embodiment may include multiple cascaded shift registers 20 according to the above embodiments.

In some embodiments, the gate driving circuit 170 may be a scanning driving circuit configured to provide a scanning signal for a pixel circuit. The scanning signal is used for controlling at least a part of transistors in the pixel circuit to be switched on/off.

In some embodiments, the gate driving circuit 170 may be a light emitting control driving circuit configured to provide a light emitting control signal to the pixel circuit. The light emitting control signal is used for controlling at least a part of transistors of the pixel circuit to be switched on/off.

In some embodiments, the gate driving circuit 170 may be arranged at a border at one side of a display panel, or may be arranged at borders at two sides of the display panel. Specific arrangement is not limited in the embodiments of the present disclosure.

Figure 18:
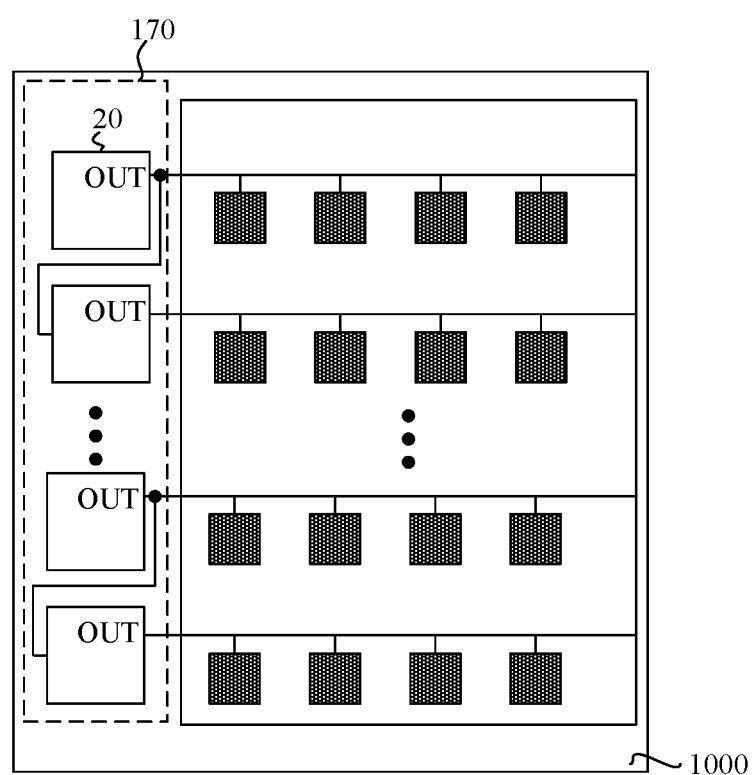
FIG. 18 is a schematic structural diagram of a display device according to an embodiment of the present disclosure.

Based on the above shift register or the gate driving circuit according to the embodiments of the present disclosure, a display device is further provided according to the present disclosure. The display device includes the shift register or the gate driving circuit described above. Reference is made to FIG. 18 which is a schematic structural diagram of a display device according to an embodiment of the present disclosure. The display device 1000 shown in FIG. 18 includes the shift register 20 or the gate driving circuit 170 according to any one of the above embodiments. In FIG. 18, the display device 1000 is shown as a smartphone for illustration. It should be understood that, the display device in the embodiment of the present disclosure may be other display devices having a display function, such as a wearable product, a computer, a television or a vehicle-mounted display device, which is not limited in the present disclosure. The display device according to the embodiment of the present disclosure can achieve the same beneficial effect as that of the shift register 20 or the gate driving circuit 170 according to the embodiments of the present disclosure. For the beneficial effect, one may refer to the specific description of the shift register 20 or the gate driving circuit 170 in the above embodiments, and details are not repeated herein.

It should be noted that, the specific structure of the circuit and the driving time sequence shown in the drawings of the embodiments of the present disclosure are only schematic and are not intended to limit the present disclosure. The embodiments of the present disclosure may be combined with each other without a conflict.

It should be understood that, the embodiments of the present disclosure are described in a progressive manner. For the same or similar parts between the embodiments, one may refer to the description in other embodiments. Each embodiment lays emphasis on the difference from other embodiments. The embodiments described in the present disclosure do not exhaust all details, and the present disclosure is not limited to the described embodiments. Apparently, many modifications and changes may be made according to the above description. The above embodiments are described to better explain the principles and actual application of the present disclosure. The present disclosure is defined only by the claims and equivalents thereof.

The above embodiments are schematic rather than restrictive. Different features described in different embodiments may be combined to obtain the beneficial effect. Other embodiments may be obtained by modifying the disclosed embodiments based on the drawings, the specification and claims. In the claims, the term "comprising" does not preclude other structures, the term "one" does not preclude multiple, and the terms "first" and "second" are used to indicate names rather than indicate any specific order. The reference numerals in the claims should not be understood as limiting to the protection scope. Features described in different dependent claims may be combined to obtain the beneficial effect.

What is claimed is:

1. A shift register, comprising:
a first output device, wherein a control terminal of the first output device is electrically connected to a first node, a first terminal of the first output device is electrically connected to a first clock signal terminal, and a second terminal of the first output device is electrically connected to an output terminal of the shift register; and
a first node control device comprising a first switch device and a second switch device, wherein a control terminal of the first switch device is electrically connected to the first node, a first terminal of the first switch device is electrically connected to a first power supply voltage signal terminal, a second terminal of the first switch device is electrically connected to a second node; a control terminal of the second switch device is electrically connected to the second node, a first terminal of the second switch device is electrically connected to the first power supply voltage signal terminal, and a second terminal of the second switch device is electrically connected to the first node,
wherein in a low level output phase, the first switch device is configured to be switched on under control of the first node and write a cut-off level of the first power supply voltage signal terminal into the second node, and the second switch device is configured to be switched off under control of the second node.

2. The shift register according to claim 1, wherein the first node control device further comprises a third switch device electrically connected to the second node;
wherein in a high level output phase, the third switch device is configured to write a turn-on level into the second node, and the second switch device is configured to be switched on under control of the second node and write the cut-off level of the first power supply voltage signal terminal into the first node.

3. The shift register according to claim 2, wherein both a control terminal and a first terminal of the third switch device are electrically connected to a second power supply voltage signal terminal, and a second terminal of the third switch device is electrically connected to the second node;
wherein in the high level output phase, the third switch device is configured to be switched on under control of the second power supply voltage signal terminal, and write a turn-on level of the second power supply voltage signal terminal into the second node.

4. The shift register according to claim 3, wherein each of the first switch device and the third switch device comprises a transistor, and an aspect ratio of a channel region of the first switch device is greater than an aspect ratio of a channel region of the third switch device.

5. The shift register according to claim 4, wherein a ratio of the aspect ratio of the channel region of the first switch device to the aspect ratio of the channel region of the third switch device is greater than or equal to 2.

6. The shift register according to claim 2, wherein a control terminal of the third switch device is electrically connected to a second power supply voltage signal terminal, a first terminal of the third switch device is electrically connected to a second clock signal terminal, and a second terminal of the third switch device is electrically connected to the second node;
wherein in the high level output phase, the third switch device is configured to be switched on under control of the second power supply voltage signal terminal and write a turn-on level of the second clock signal terminal into the second node.

7. The shift register according to claim 6, wherein in the low level output phase, the third switch device is configured to be switched on under control of the second power supply voltage signal terminal, and write a cut-off level of the second clock signal terminal into the second node.

8. The shift register according to claim 2, wherein a control terminal of the third switch device is electrically connected to a second clock signal terminal, a first terminal of the third switch device is electrically connected to a second power supply voltage signal terminal, and a second terminal of the third switch device is electrically connected to the second node;
  wherein in the high level output phase, the third switch device is configured to be switched on under control of the second clock signal terminal, and write a turn-on level of the second power supply voltage signal terminal into the second node.

9. The shift register according to claim 8, wherein in the low level output phase, the third switch device is configured to be switched off under control of the second clock signal terminal.

10. The shift register according to claim 1, further comprising:
  a first switch device, wherein a control terminal of the first switch device is electrically connected to a second power supply voltage signal terminal, a first terminal of the first switch device is electrically connected to the first node, and a second terminal of the first switch device is electrically connected to the control terminal of the first output device.

11. The shift register according to claim 1, wherein the first node control device further comprises a fourth switch device, a control terminal of the fourth switch device is electrically connected to a third cock signal terminal, a first terminal of the fourth switch device is electrically connected to an input terminal of the shift register, a second terminal of the fourth switch device is electrically connected to the first node, and the fourth switch device is configured to write a turn-on level or a cut-off level of the input terminal of the shift register into the first node under control of a third clock signal terminal.

12. The shift register according to claim 11, wherein the fourth switch device comprises a first sub-transistor and a second sub-transistor connected in series, both a gate of the first sub-transistor and a gate of the second sub-transistor are electrically connected to the third clock signal terminal, a first pole of the first sub-transistor is electrically connected to the input terminal of the shift register, a second pole of the first sub-transistor is electrically connected to a first pole of the second sub-transistor, and a second pole of the second sub-transistor is electrically connected to the first node.

13. The shift register according to claim 1, further comprising:
  a first coupling device, wherein a first terminal of the first coupling device is electrically connected to an output terminal of the shift register, and a second terminal of the first coupling device is electrically connected to the control terminal of the first output device;
  a second output device, wherein a control terminal of the second output device is electrically connected to a third node, a first terminal of the second output device is electrically connected to the first power supply voltage signal terminal, and a second terminal of the second output device is electrically connected to an output terminal of the shift register; and
  a third node control device comprising a fifth switch device and a sixth switch device, wherein a control terminal of the fifth switch device is electrically connected to the first node, a first terminal of the fifth switch device is electrically connected to a third clock signal terminal, a second terminal of the fifth switch device is electrically connected to the third node, a control terminal of the sixth switch device is electrically connected to the third clock signal terminal, a first terminal of the sixth switch device is electrically connected to a second power supply voltage signal terminal, and a second terminal of the sixth switch device is electrically connected to the third node.

14. The shift register according to claim 13, further comprising:
  a first storage device, wherein a first terminal of the first storage device is electrically connected to the output terminal of the shift register, and a second terminal of the first storage device is electrically connected to the control terminal of the second output device.

15. A method for driving a shift register, wherein the shift register is the shift register according to claim 1, and the method comprises:
  providing a turn-on level to the first node in the low level output phase, wherein the first switch device is switched on under control of the first node and writes a cut-off level of the first power supply voltage signal terminal into the second node, and the second switch device is switched off under control of the second node.

16. The method according to claim 15, wherein the first node control device further comprises a third switch device electrically connected to the second node, and the method further comprises:
  controlling the third switch device to write a turn-on level into the second node in a high level output level, wherein the second switch device is switched on under control of the second node, and writes a cut-off level of the first power supply voltage signal terminal into the first node.

17. The method according to claim 16, wherein the first node control device further comprises a fourth switch device, a control terminal of the fourth switch device is electrically connected to a third clock signal terminal, a first terminal of the fourth switch device is electrically connected to an input terminal of the shift register, and a second terminal of the fourth switch device is electrically connected to the first node;
  wherein the shift register further comprises:
  a second output device, wherein a control terminal of the second output device is electrically connected to a third node, a first terminal of the second output device is electrically connected to the first power supply voltage signal terminal, a second terminal of the second output device is electrically connected to an output terminal of the shift register;
  a third node control device comprising a fifth switch device and a sixth switch device, wherein a control terminal of the fifth switch device is electrically connected to the first node, a first terminal of the fifth switch device is electrically connected to a third clock signal terminal, and a second terminal of the fifth switch device is electrically connected to the third node; a control terminal of the sixth switch device is electrically connected to the third clock signal terminal, a first terminal of the sixth switch device is electrically connected to a second power supply voltage signal terminal, and a second terminal of the sixth switch device is electrically connected to the third node;
  a first coupling device, wherein a first terminal of the first coupling device is electrically connected to an output terminal of the shift register, and a second terminal of the first coupling device is electrically connected to the control terminal of the first output device; and a first storage device, wherein a first terminal of the first storage device is electrically connected to the output terminal of the shift register, and a second terminal of the first storage device is electrically connected to the control terminal of the second output device;

wherein a high level output phase comprises a first high level output phase before the low level output phase, and the method further comprises:

in the first high level output phase, providing a turn-on level to the third clock signal terminal and the input terminal of the shift register, and providing a cut-off level to the first clock signal terminal, wherein the fourth switch device is switched on in response to the turn-on level of the third clock signal terminal and writes a turn-on level of the input terminal of the shift register into the first node; the first output device is switched on in response to the turn-on level of the first node and transmits a high level of the first clock signal terminal to the output terminal of the shift register; the fifth switch device is switched on in response to the turn-on level of the first node and transmits the turn-on level of the third clock signal terminal to the third node; and the second output device is switched on in response to a turn-on level of the third node, and transmits a high level of the first power supply voltage signal terminal to the output terminal of the shift register.

18. The method according to claim 17, wherein the high level output phase further comprises at least one of a second high level output phase, a third high level output phase and a fourth high level output phase after the low level output phase, and the method comprises:

In the second high level output phase, providing a turn-on level to the third clock signal terminal and providing a cut-off level to a first lock signal terminal and the input terminal of the shift register, wherein the fourth switch device is switched on in response to the turn-on level of the third clock signal terminal and writes the cut-off level of the input terminal of the shift register into the first node; the first output device is switched off in response to a cut-off level of the first node; the sixth switch device is switched on in response to the turn-on level of the third clock signal terminal and transmits a turn-on level of the second power supply voltage signal terminal to the third node; and the second output device is switched on in response to the turn-on level of the third node, and transmits a high level of the first power supply voltage signal terminal to an output terminal of the shift register;

in the third high level output level, providing a turn-on level to the first clock signal terminal and providing a cut-off level to the third clock signal terminal and the input terminal of the shift register, wherein the fourth switch device is switched off in response to the cut-off level of the third clock signal terminal; the first coupling device maintains the cut-off level of the first node; the first output device is switched off in response to the cut-off level of the first node; the first storage device maintains the turn-on level of the third node; the second output device is switched on in response to the turn-on level of the third node, and transmits the high level of the first power supply voltage signal terminal to the output terminal of the shift register; and in the fourth high level output level, providing a turn-on level to the third clock signal terminal and providing a cut-off level to the first clock signal terminal and the input terminal of the shift register, wherein the fourth switch device is switched on in response to the turn-on level of the third clock signal terminal and writes the cut-off level of the input terminal of the shift register into the first node; the first output device is switched off in response to the cut-off level of the first node; the first storage device maintains the turn-on level of the third node; and the second output device is switched on in response to the turn-on level of the third node and transmits the high level of the first power supply voltage signal terminal to the output terminal of the shift register.

19. A gate driving circuit, comprising:
a plurality of cascaded shift registers, comprising:
a first output device, wherein a control terminal of the first output device is electrically connected to a first node, a first terminal of the first output device is electrically connected to a first clock signal terminal, and a second terminal of the first output device is electrically connected to an output terminal of the shift register; and
a first node control device comprising a first switch device and a second switch device, wherein a control terminal of the first switch device is electrically connected to the first node, a first terminal of the first switch device is electrically connected to a first power supply voltage signal terminal, a second terminal of the first switch device is electrically connected to a second node; a control terminal of the second switch device is electrically connected to the second node, a first terminal of the second switch device is electrically connected to the first power supply voltage signal terminal, and a second terminal of the second switch device is electrically connected to the first node,
wherein in a low level output phase, the first switch device is configured to be switched on under control of the first node and write a cut-off level of the first power supply voltage signal terminal into the second node, and the second switch device is configured to be switched off under control of the second node.

20. A display panel, comprising:
a gate driving circuit, comprising:
a plurality of cascaded shift registers, comprising:
a first output device, wherein a control terminal of the first output device is electrically connected to a first node, a first terminal of the first output device is electrically connected to a first clock signal terminal, and a second terminal of the first output device is electrically connected to an output terminal of the shift register; and
a first node control device comprising a first switch device and a second switch device, wherein a control terminal of the first switch device is electrically connected to the first node, a first terminal of the first switch device is electrically connected to a first power supply voltage signal terminal, a second terminal of the first switch device is electrically connected to a second node; a control terminal of the second switch device is electrically connected to the second node, a first terminal of the second switch device is electrically connected to the first power supply voltage signal terminal, and a second terminal of the second switch device is electrically connected to the first node,
wherein in a low level output phase, the first switch device is configured to be switched on under control of the first node and write a cut-off level of the first power supply voltage signal terminal into the second node, and the second switch device is configured to be switched off under control of the second node.

* * * * *